United States Patent
Morikado

(10) Patent No.: US 7,449,375 B2
(45) Date of Patent: Nov. 11, 2008

(54) FIN SEMICONDUCTOR DEVICE AND METHOD FOR FABRICATING THE SAME

(75) Inventor: Mutsuo Morikado, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 296 days.

(21) Appl. No.: 11/478,742

(22) Filed: Jun. 30, 2006

(65) Prior Publication Data
US 2006/0244106 A1 Nov. 2, 2006

Related U.S. Application Data

(62) Division of application No. 10/801,442, filed on Mar. 16, 2004, now Pat. No. 7,145,220.

(30) Foreign Application Priority Data

Mar. 17, 2003 (JP) .............................. 2003-072220

(51) Int. Cl.
  *H01L 21/84* (2006.01)
  *H01L 21/00* (2006.01)
(52) U.S. Cl. .................. 438/151; 438/243; 257/304
(58) Field of Classification Search ................. 257/304; 438/243, 151
  See application file for complete search history.

(56) References Cited

U.S. PATENT DOCUMENTS

| 5,844,278 | A | 12/1998 | Mizuno et al. |
| 6,300,683 | B1 | 10/2001 | Nagasaka et al. ........... 257/774 |
| 6,413,802 | B1 | 7/2002 | Hu et al. |
| 6,525,403 | B2 | 2/2003 | Inaba et al. .................. 257/618 |
| 6,885,055 | B2 | 4/2005 | Lee ............................. 257/308 |
| 2003/0151077 | A1 | 8/2003 | Mathew et al. .............. 257/250 |
| 2004/0229424 | A1 | 11/2004 | Fischer et al. ............... 438/232 |

FOREIGN PATENT DOCUMENTS

| JP | 57-007161 | 1/1982 |
| JP | 58-78466 | 5/1983 |
| JP | 03-208373 | 9/1991 |
| JP | 04-162727 | 6/1992 |
| JP | 5-167043 | 7/1993 |
| JP | 8-139325 | 5/1996 |
| JP | 11-68069 | 3/1999 |
| JP | 2000-150414 | 5/2000 |
| JP | 2002-110963 | 4/2002 |
| JP | 2003-007856 | 1/2003 |

*Primary Examiner*—Thao X. Le
*Assistant Examiner*—Tanika Warrior
(74) *Attorney, Agent, or Firm*—Frommer Lawrence & Haug LLP

(57) ABSTRACT

A semiconductor device includes second to fourth semiconductor layers, a gate electrode, and an insulating film. The second semiconductor layer is formed on a first semiconductor layer and has a projecting shape. The third and fourth semiconductor layers are formed on the first semiconductor layer to be in contact with the second semiconductor layer and oppose each other via the second semiconductor layer. The gate electrode is in contact with the second semiconductor layer with a gate insulating film interposed therebetween and forms a channel in the second semiconductor layer. The insulating film is formed in the first semiconductor layer located immediately under the third and fourth semiconductor layers.

6 Claims, 25 Drawing Sheets

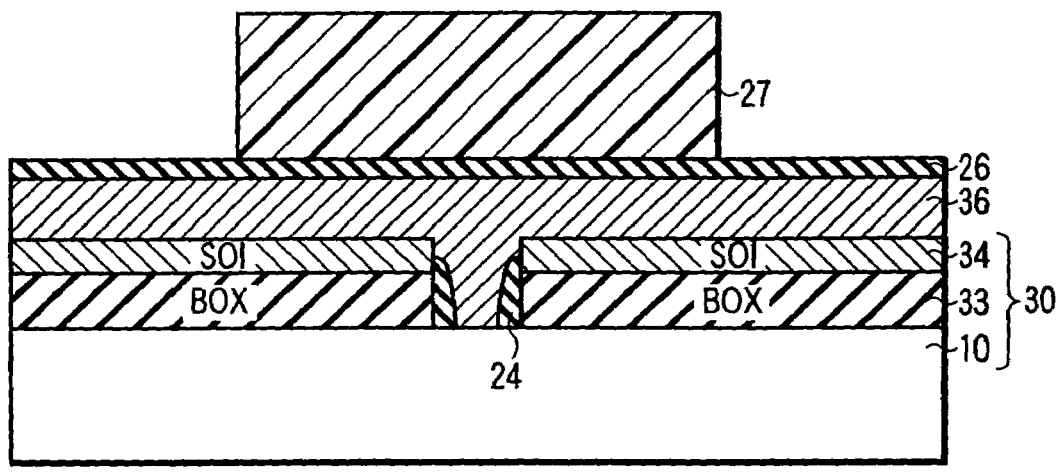
F I G. 22
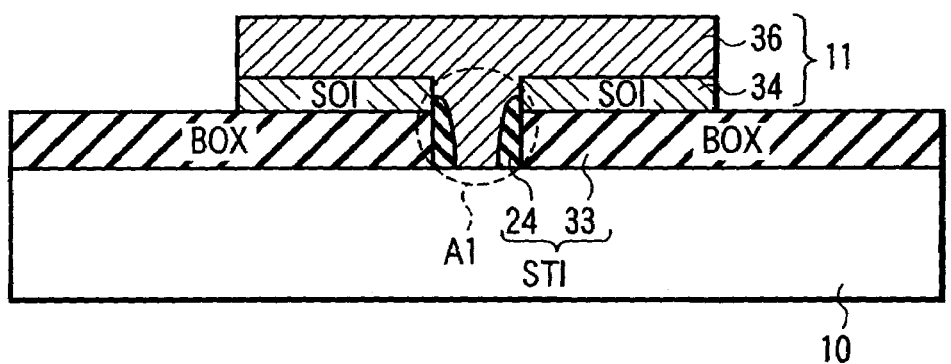
F I G. 23
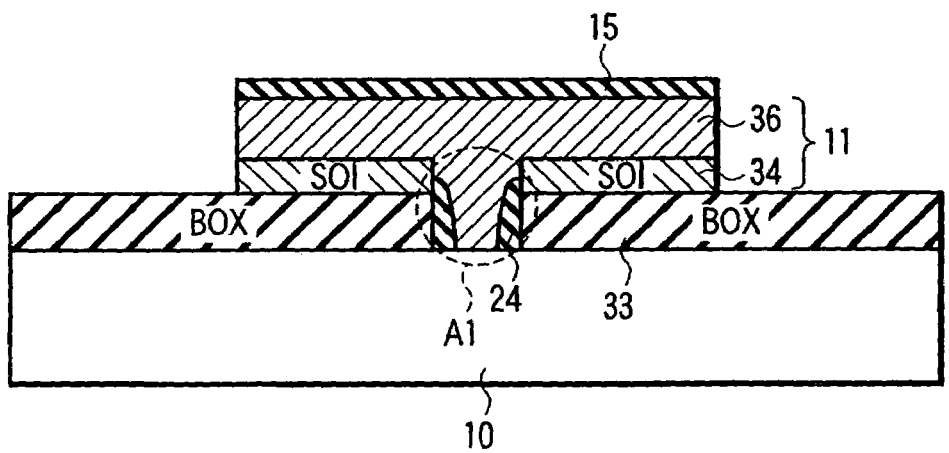
F I G. 24

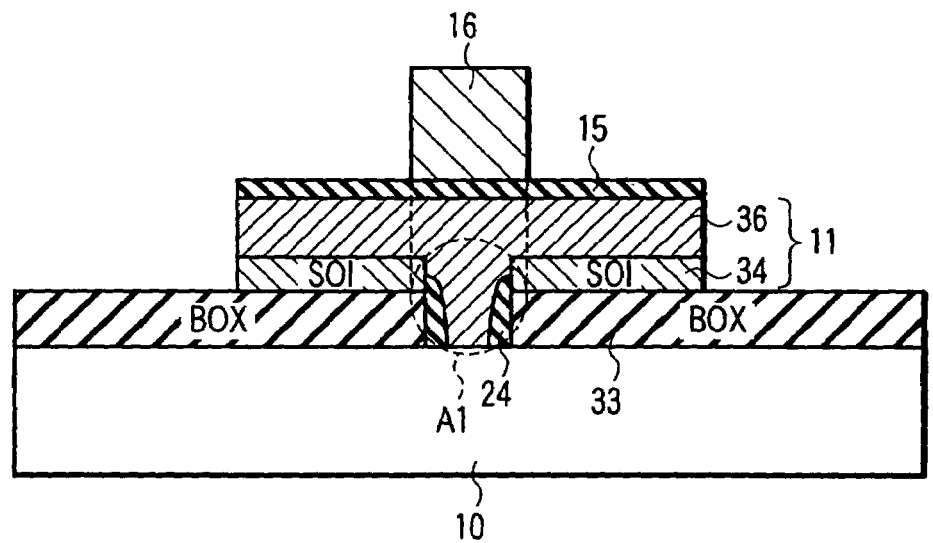
F I G. 25
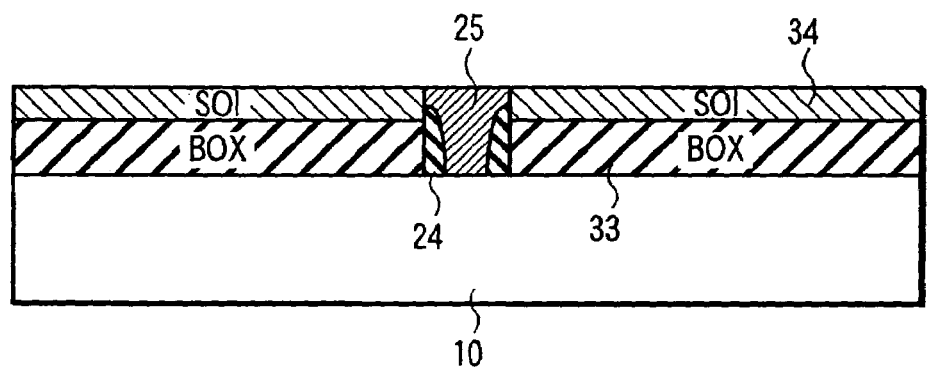
F I G. 26
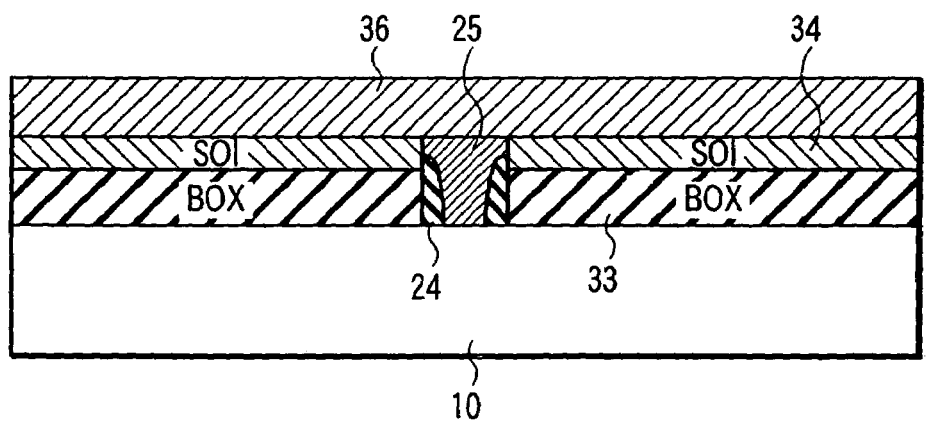
F I G. 27

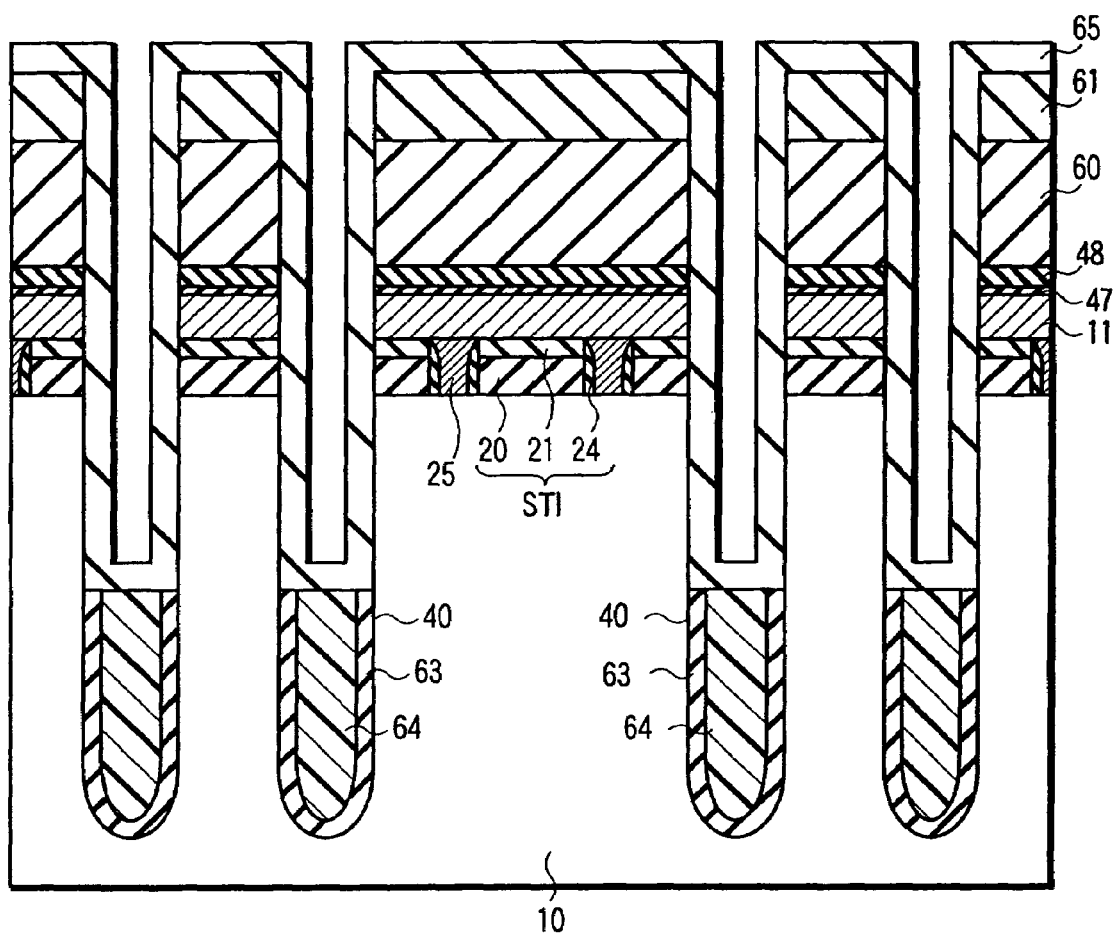
F I G. 32

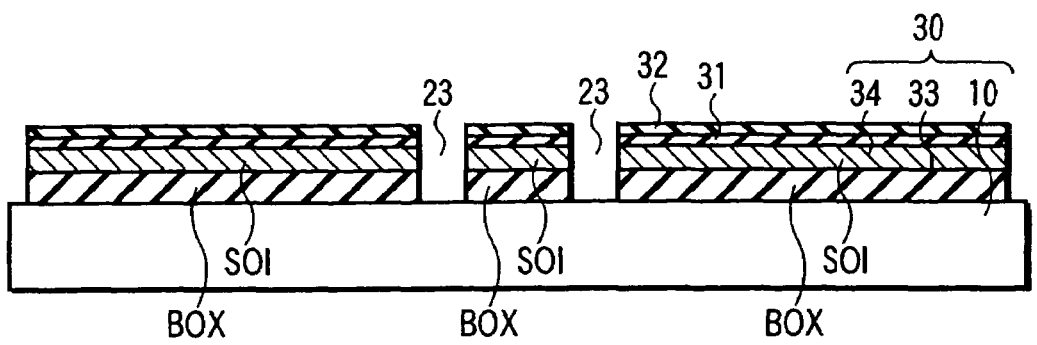
F I G. 39
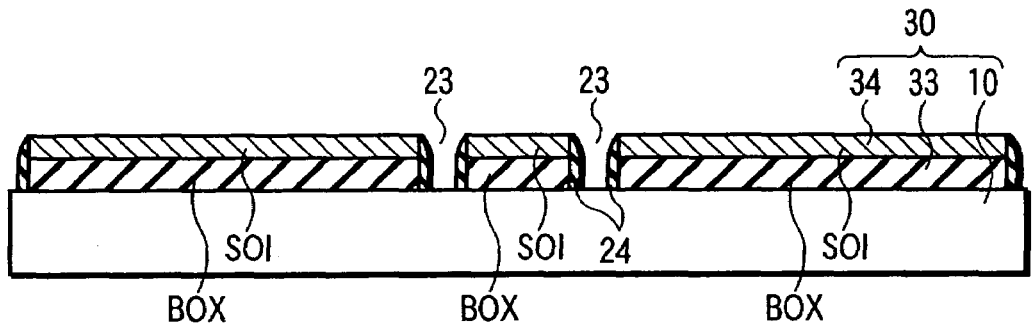
F I G. 40
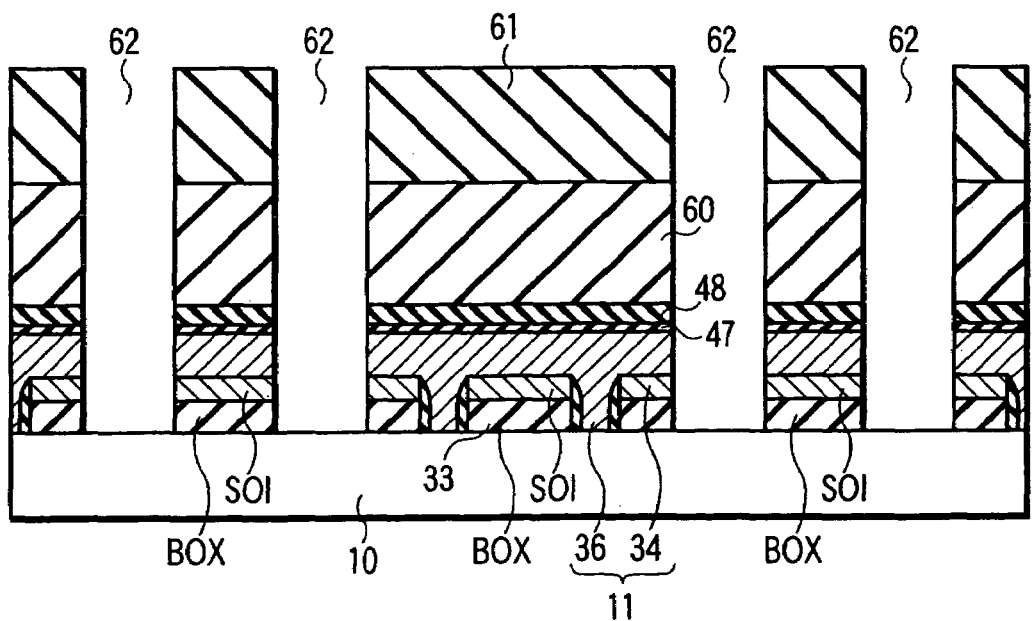
F I G. 41

FIN SEMICONDUCTOR DEVICE AND METHOD FOR FABRICATING THE SAME

CROSS-REFERENCE TO RELATED APPLICATIONS

This application is a divisional of Ser. No. 10/801,442, filed Mar. 16, 2004, now U.S. Pat. No. 7,145,220, the entire contents of which are incorporated by reference. reference.

BACKGROUND OF THE INVENTION

1. Field of the Invention

The present invention relates to a semiconductor device and a method for fabricating the same. The present invention relates to, e.g., a fin MOS transistor.

2. Description of the Related Art

Recent microfabrication of semiconductor devices is striking. However, along with the microfabrication, the performance of a planar MOS transistor cannot improve anymore because of the physical limit. To break the limit of the planar MOS transistor, a fin MOS transistor (double-gate MOS transistor) has been proposed. A fin MOS transistor is described in, e.g., Jpn. Pat. Appln. KOKAI Publication No. 8-139325.

FIG. 1 is a sectional view of a fin MOS transistor described in Jpn. Pat. Appln. KOKAI Publication No. 8-139325. As shown in FIG. 1, a fin-shaped semiconductor layer (channel region) 120 is formed on an element region AA surrounded by an insulating film 110 formed in a semiconductor substrate (well region) 100. A source layer 130 and drain layer 140 are formed on the well region 100 to oppose each other via the channel region 120. A gate electrode 150 is formed on the upper surface of the channel region 120.

In the fin MOS transistor having the above structure, the current supply capability can be improved, as compared to a planar MOS transistor. In addition, the gate width can be further decreased. The gate electrode 150 surrounds the channel region 120. Hence, a leakage current that flows through the channel region 120 can easily be controlled, and the reliability of the MOS transistor can be increased.

However, even the conventional fin MOS transistor cannot solve all problems related to leakage current control. As described above, a fin MOS transistor can easily control a leakage current that flows through the channel region 120. However, it is difficult to control a leakage current that flows through the well region 100, as shown in FIG. 1. This is because a current that flows through the well region 100 is poorly controlled by the gate electrode 150. To solve this problem, for example, the impurity concentration in the well region 100 under the channel region 120 is increased. However, this measure causes a degradation in performance by, e.g., increasing the capacitance between the well region 100 and the source layer 130 and drain layer 140. As described above, the conventional fin MOS transistor has the same problem as that of a planar MOS transistor.

BRIEF SUMMARY OF THE INVENTION

A semiconductor device according to an aspect of the present invention comprises:

a projecting second semiconductor layer which is formed on a first semiconductor layer;

third and fourth semiconductor layers which are formed on the first semiconductor layer to be in contact with the second semiconductor layer and oppose each other via the second semiconductor layer;

a gate electrode which is in contact with the second semiconductor layer with a gate insulating film interposed therebetween and forms a channel in the second semiconductor layer; and an insulating film which is formed in the first semiconductor layer located immediately under the third and fourth semiconductor layers.

A method for fabricating a semiconductor device according to an aspect of the present invention comprises:

forming a first insulating film on a first semiconductor layer;

making a hole that reaches the first semiconductor layer in the first insulating film;

forming a second semiconductor layer on the first insulating film and in the hole;

patterning the second semiconductor layer into a columnar shape to make part of the second semiconductor layer cover the hole;

forming a gate insulating film on a side surface of the second semiconductor layer;

forming a third semiconductor layer on the gate insulating film and first insulating film;

patterning the third semiconductor layer and leaving the third semiconductor layer on a side surface of the second semiconductor layer in a region that should be a channel region to form a gate electrode; and forming source and drain regions in a region of the second semiconductor layer located on the first insulating film.

BRIEF DESCRIPTION OF THE SEVERAL VIEWS OF THE DRAWING

FIGS. 17 to 25 are sectional views sequentially showing steps in fabricating a semiconductor device according to the second embodiment of the present invention;

FIGS. 26 and 27 are sectional views sequentially showing steps in fabricating a semiconductor device according to a modification to the second embodiment of the present invention;

FIGS. 32 to 34 are sectional views of the fourth to sixth steps in fabricating the semiconductor device according to the third embodiment of the present invention;

FIGS. 39 to 41 are sectional views sequentially showing steps in fabricating a semiconductor device according to the fourth embodiment of the present invention.

DETAILED DESCRIPTION OF THE INVENTION

Figure 2:
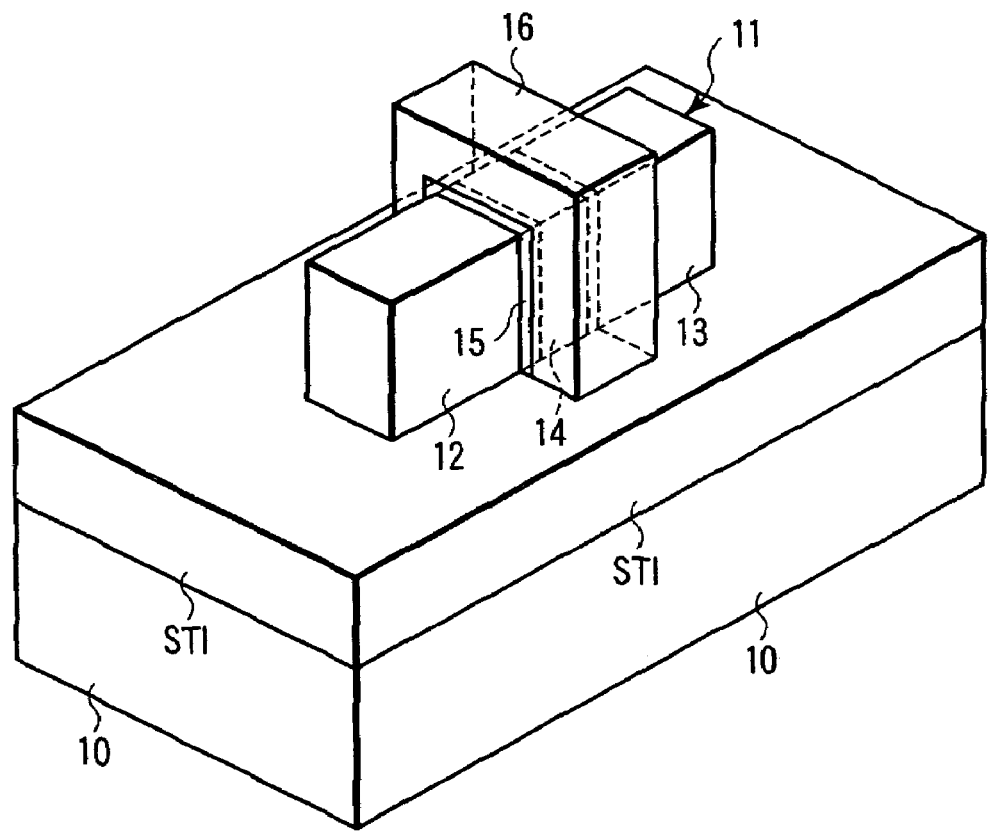
FIG. 2 is a perspective view of a semiconductor device according to the first embodiment of the present invention.
Figure 3A:
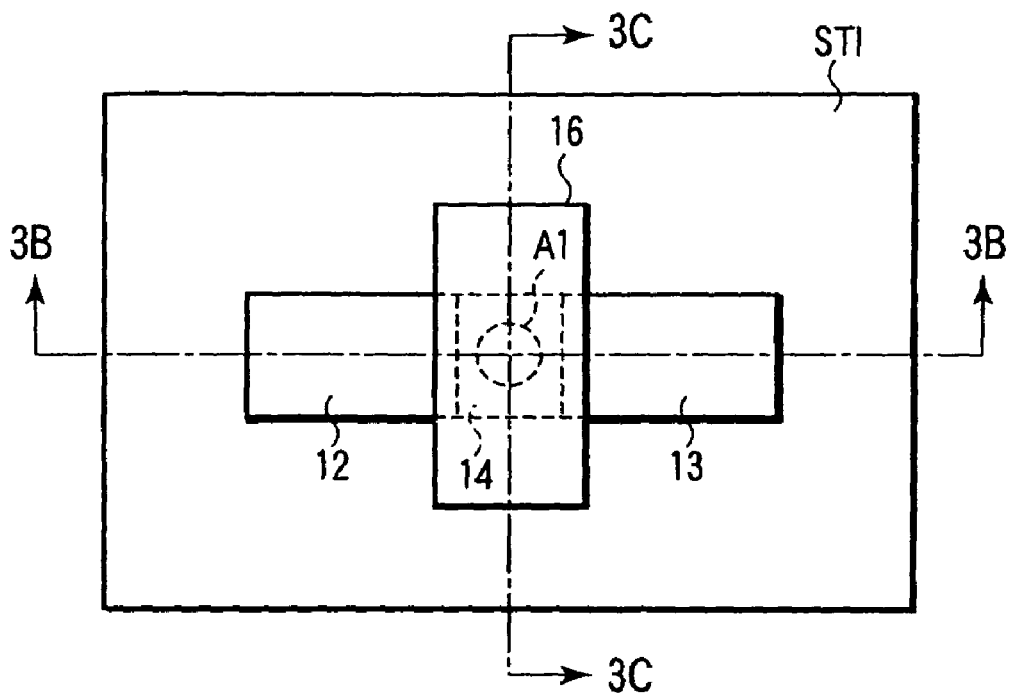
FIG. 3A is a plan view of the semiconductor device according to the first embodiment of the present invention.
Figure 3B:
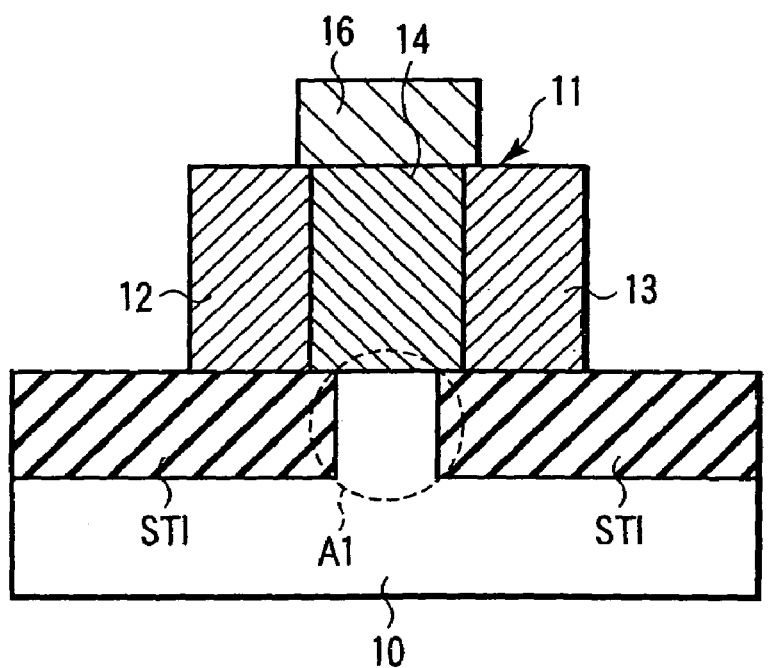
FIG. 3B is a sectional view taken along a line 3B-3B in FIG. 3A.
Figure 3C:
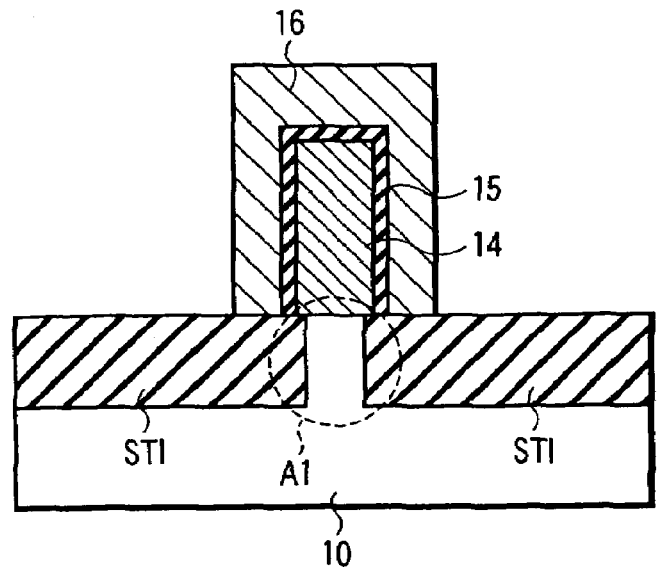
FIG. 3C is a sectional view taken along a line 3C-3C in FIG. 3A.

A semiconductor device according to the first embodiment of the present invention will be described with reference to FIGS. 2 to 3C. FIGS. 2 to 3C show a fin MOS transistor according to the first embodiment. FIG. 2 is a perspective view. FIG. 3A is a plan view. FIG. 3B is a sectional view taken along a line 3B-3B in FIG. 3A. FIG. 3C is a sectional view taken along a line 3C-3C in FIG. 3A.

The planar structure of the fin MOS transistor according to this embodiment will be described first with reference to FIGS. 2 and 3A. As shown in FIGS. 2 and 3A, an insulating film STI is formed in a semiconductor substrate 10. A fin-shaped semiconductor layer 11 is formed on the insulating film STI. The fin-shaped semiconductor layer 11 has a source region 12, drain region 13, and channel region 14 respectively formed on the insulating film STI. The source region 12 and drain region 13 oppose each other via the channel region 14. In a partial region immediately under the channel region 14, the insulating film STI is removed, and a connection region A1 made of a semiconductor layer is formed. The connection region A1 electrically connects the semiconductor substrate 10 and channel region 14. The upper surface of the connection region A1 is completely covered with the channel region 14. Hence, the source region 12 and drain region 13 are isolated from the semiconductor substrate 10 by the insulating film STI. A gate electrode 16 is formed on the semiconductor layer 11 with a gate insulating film 15 interposed therebetween. The gate electrode 16 surrounds the channel region 14.

FIGS. 3B and 3C are sectional views of the fin MOS transistor. As shown in FIGS. 3B and 3C, the fin-shaped (projecting) channel region 14 is formed on the semiconductor substrate 10. The source region 12 and drain region 13 are formed on the semiconductor substrate 10 to be in contact with the channel region 14 and oppose each other via the channel region 14. The channel region 14, source region 12, and drain region 13 form the fin-shaped (projecting) semiconductor layer 11. The gate electrode 16 is formed to be in contact with the channel region 14 with the gate insulating film 15 interposed therebetween. The gate electrode 16 forms a channel in the channel region 14 between the source region 12 and the drain region 13.

The insulating film STI is formed in the semiconductor substrate 10 immediately under the source region 12 and drain region 13. As described above, the insulating film STI is not formed in a partial region immediately under the channel region 14. The region where the insulating film STI is not formed is the connection region A1 which electrically connects the semiconductor substrate 10 and channel region 14.

A method for fabricating the fin MOS transistor having the above structure will be described next with reference to FIGS. 4, 5A, 5B, 6 to 11, 12A, 12B, 13, 14, 15A, and 15B. FIGS. 4, 5B, 6 to 11, 12B, 13, 14, and 15B are sectional views sequentially showing steps in fabricating the fin MOS transistor corresponding to the direction along the line 3B-3B in FIG. 3A. FIGS. 5A, 12A, and 15A are plan views respectively corresponding to the steps shown in FIGS. 5B, 12B, and 15B. FIG. 5B is a sectional view taken along a line 5B-5B in FIG. 5A. FIG. 12B is a sectional view taken along a line 12B-12B in FIG. 12A. FIG. 15B is a sectional view taken along a line 15B-15B in FIG. 15A.

Figure 4:
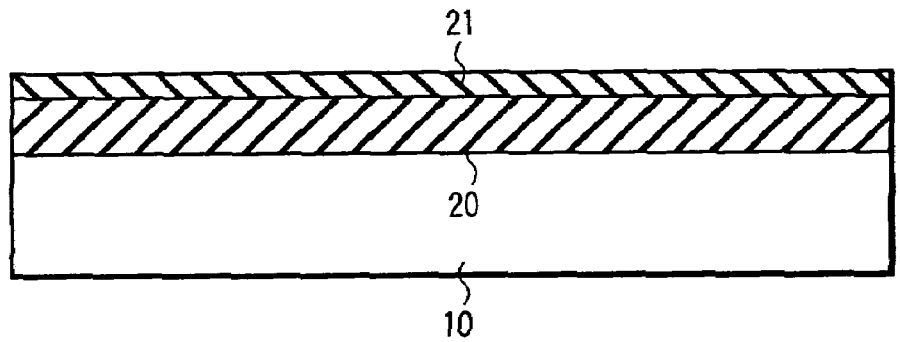
FIG. 4 is a sectional view of the first step in fabricating the semiconductor device according to the first embodiment of the present invention.
Figure 5A:
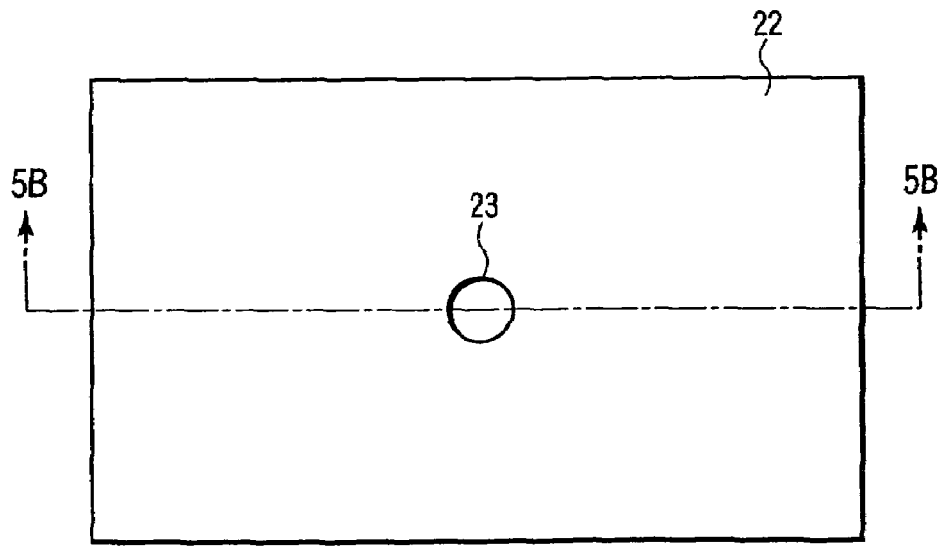
FIG. 5A is a plan view of the second step in fabricating the semiconductor device according to the first embodiment of the present invention.
Figure 5B:
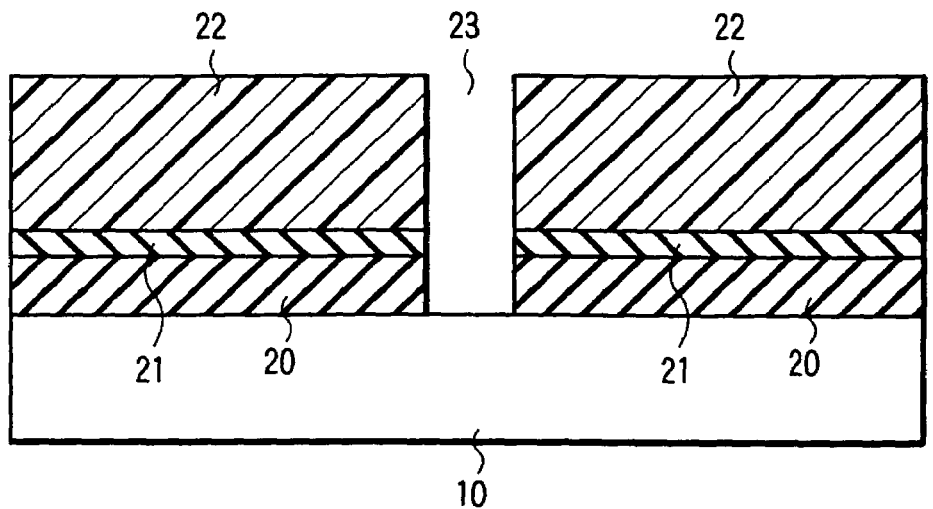
FIG. 5B is a sectional view taken along a line 5B-5B in FIG. 5A.

First, as shown in FIG. 4, a silicon oxide film 20 having a thickness of about 1,000 Å is formed on the semiconductor (silicon) substrate 10 by, e.g., thermal oxidation. A silicon nitride (SiN) film 21 having a thickness of about 300 Å is formed on the silicon oxide film 20 by, e.g., CVD (Chemical Vapor Deposition).

As shown in FIGS. 5A and 5B, a photoresist 22 is applied onto the silicon nitride film 21. The photoresist 22 is patterned into a pattern as shown in FIG. 5A by photolithography. The silicon nitride film 21 and silicon oxide film 20 are etched by anisotropic etching such as RIE (Reactive Ion Etching) using the photoresist 22 as a mask. As a result, a hole 23 as shown in FIGS. 5A and 5B is formed. The silicon substrate 10 is exposed to the bottom surface of the hole 23. The hole 23 is used to form the connection region A1 described with reference to FIGS. 2 to 3C. The hole 23 is so formed that its diameter equals the minimum process size of photolithography.

Figure 6:
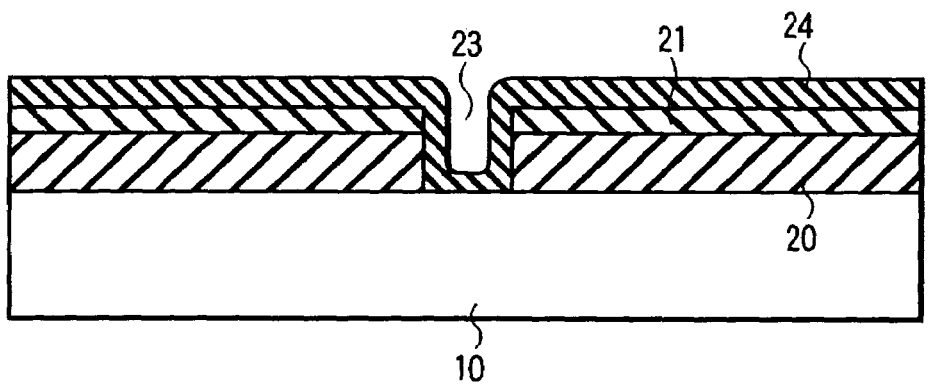
FIGS. 6 to 11 are sectional views of the third to eighth steps in fabricating the semiconductor device according to the first embodiment of the present invention.

The photoresist 22 is removed by ashing or the like. Then, as shown in FIG. 6, a silicon oxide film 24 having a thickness of about 300 Å is formed on the silicon nitride film 21 and in the hole 23 by, e.g., LPCVD (Low Pressure CVD). At this time, the silicon oxide film 24 is uniformly deposited even on the inner sidewall of the hole 23. The silicon oxide film 24 does not fill the hole 23. Hence, the thickness of the silicon oxide film 24 must be smaller than the radius of the hole 23.

Figure 7:
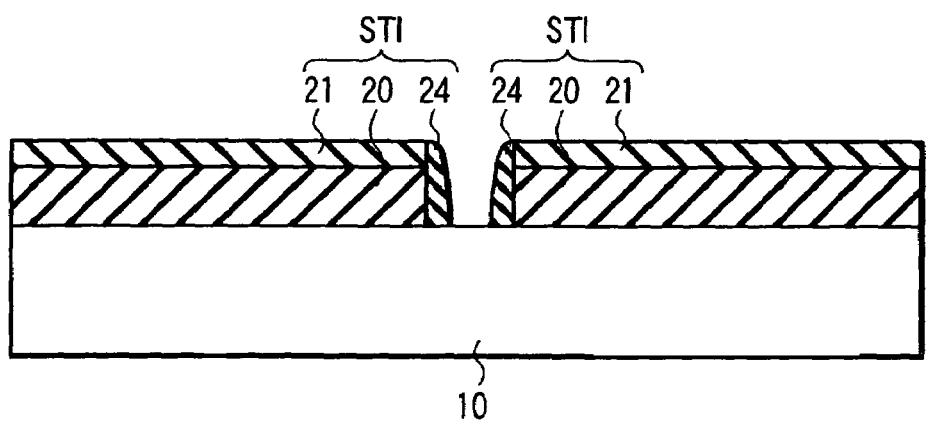

As shown in FIG. 7, the silicon oxide film 24 is etched by RIE or the like. As a consequence, the silicon oxide film 24 remains only on the inner sidewall of the hole 23. The silicon substrate 10 is exposed to the bottom portion of the hole 23. With this process, the insulating film STI including the silicon oxide films 20 and 24 and the silicon nitride film 21 is completed. In addition, since the silicon oxide film 24 is formed on the sidewall of the hole 23, the diameter of the hole 23 becomes smaller than the minimum process size. The silicon nitride film 21 may be removed at this time. In this case, the insulating film STI is formed from the silicon oxide films 20 and 24.

Figure 8:
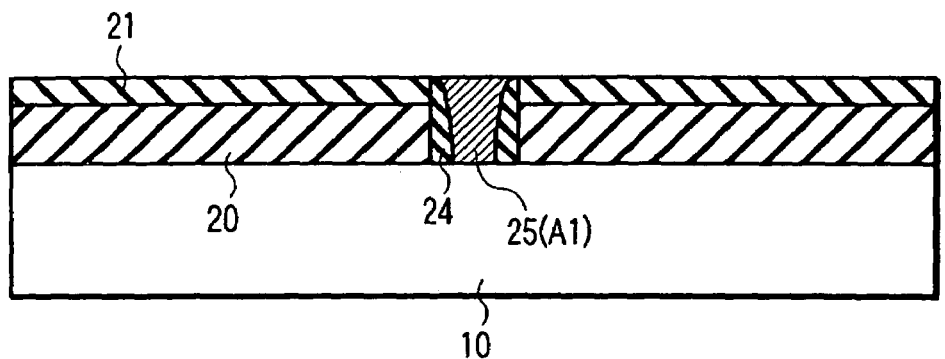

As shown in FIG. 8, a silicon layer 25 is selectively formed on the silicon substrate 10 at the bottom portion of the hole 23 by selective epitaxial growth or the like. The silicon layer 25 is formed to be so thick as to reach the upper surface of the silicon nitride film 21. The silicon layer 25 in the hole 23 functions as the connection region A1 described with reference to FIGS. 2 to 3C.

Figure 9:
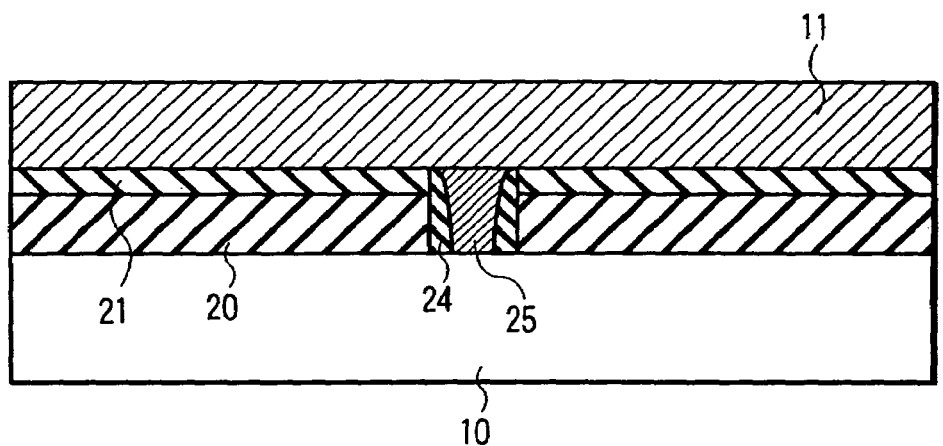

As shown in FIG. 9, an amorphous silicon layer 11 having a thickness of about 1,500 Å is formed on the silicon nitride film 21 and silicon layer 25 by, e.g., CVD. The amorphous silicon layer 11 is crystallized into single crystal by annealing for a long time in an atmosphere suitable for the growth of silicon crystal.

Additionally, to adjust the threshold voltage of the MOS transistor, the silicon layer 11 is doped with an impurity using ion implantation.

Figure 10:
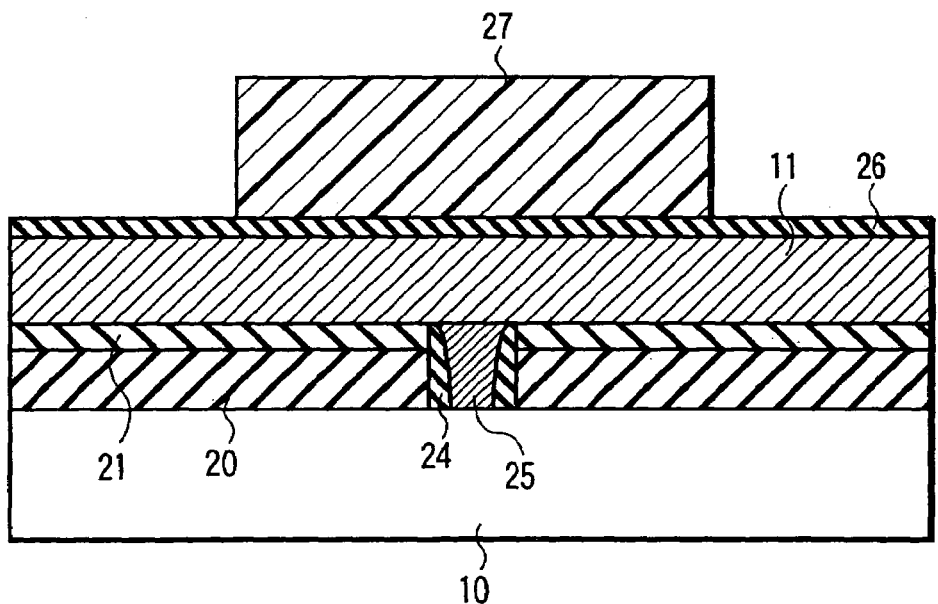

As shown in FIG. 10, a silicon oxide film 26 is formed on the silicon layer 11. A photoresist 27 is applied onto the silicon oxide film 26. The photoresist 27 is patterned, as shown in FIG. 10, by photolithography. This photoresist pattern is the formation pattern of the semiconductor layer 11 shown in FIGS. 2 to 3C.

Figure 11:
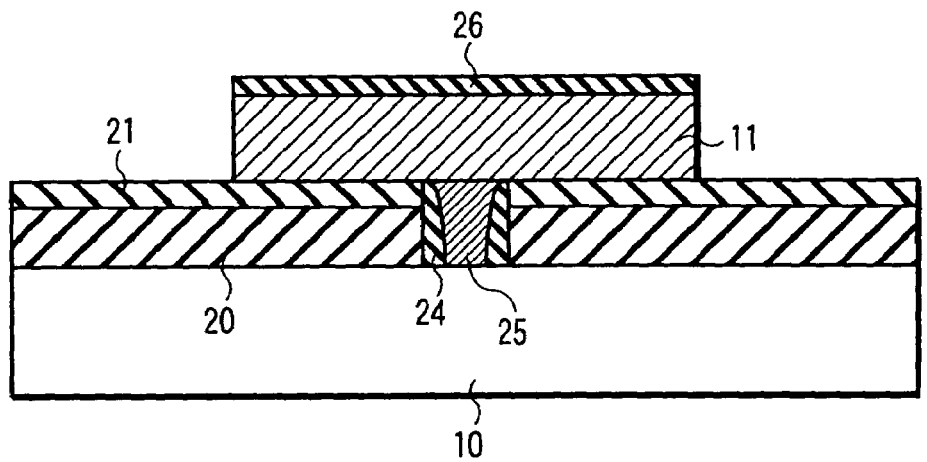
Figure 12A:
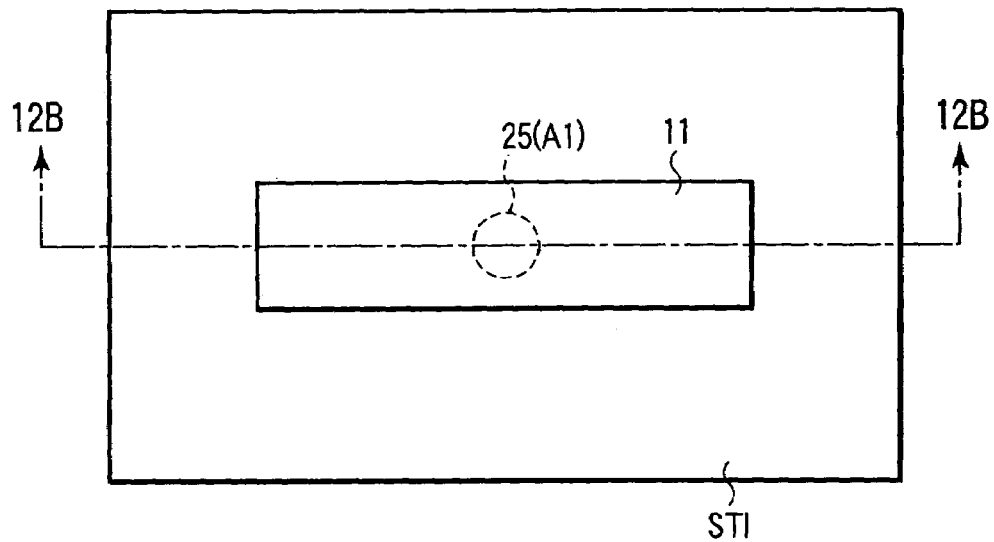
FIG. 12A is a plan view of the ninth step in fabricating the semiconductor device according to the first embodiment of the present invention.
Figure 12B:
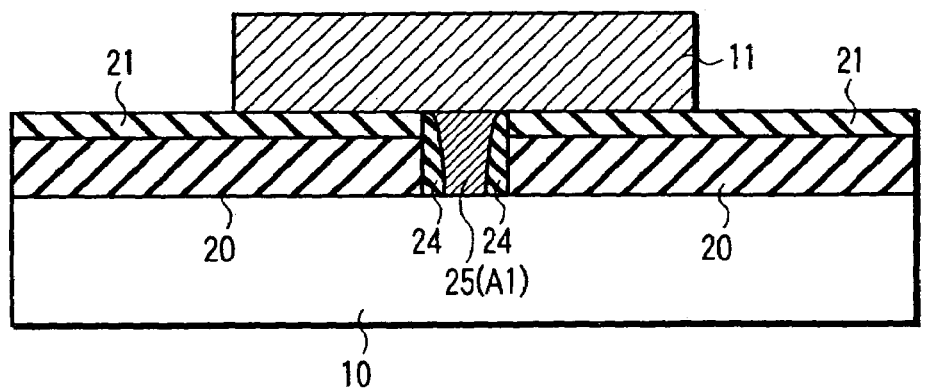
FIG. 12B is a sectional view taken along a line 12B-12B in FIG. 12A.

As shown in FIG. 11, the silicon oxide film 26 and silicon layer 11 are etched by RIE or the like using the photoresist 27 as a mask. After that, the photoresist 27 is removed by ashing or the like.

Next, the silicon oxide film 26 is removed by wet etching using, e.g., an HF-based etchant. If the silicon oxide film 24 formed in the step shown in FIG. 6 remains on the silicon nitride film 21, the silicon oxide film 24 is also removed in this step.

As a result, the fin-shaped silicon layer 11 as shown in FIGS. 12A and 12B is formed. The silicon layer 25 is formed in the region immediately under almost the central portion of the silicon layer 11. The insulating film STI is formed in the remaining region.

The silicon substrate 10 and silicon layer 11 are electrically connected through the silicon layer 25.

Figure 13:
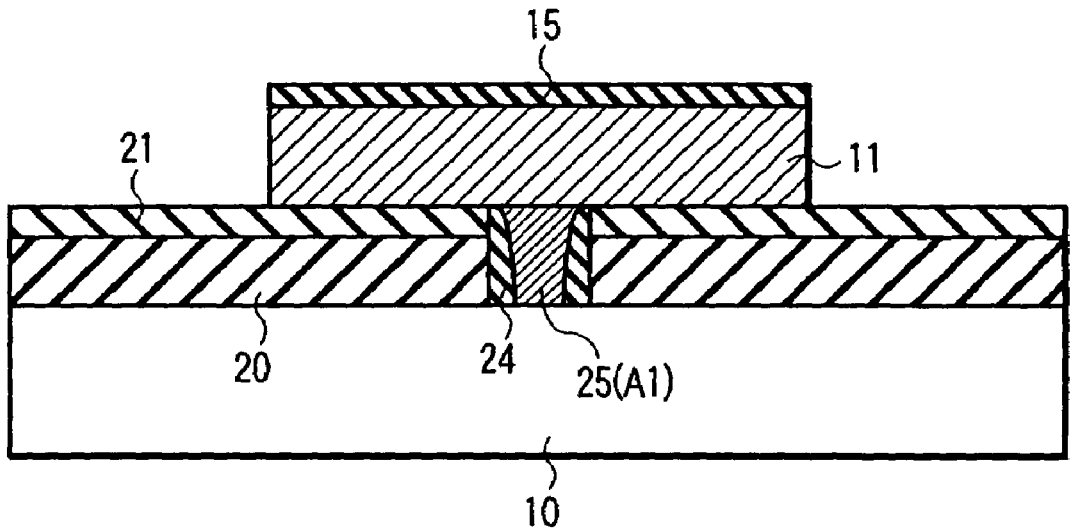
FIGS. 13 and 14 are sectional views of the 10th and 11th steps in fabricating the semiconductor device according to the first embodiment of the present invention.

As shown in FIG. 13, a gate insulating film 15 having a thickness of about 20 Å is formed on the surface of the silicon layer 11 by, e.g., thermal oxidation.

Figure 14:
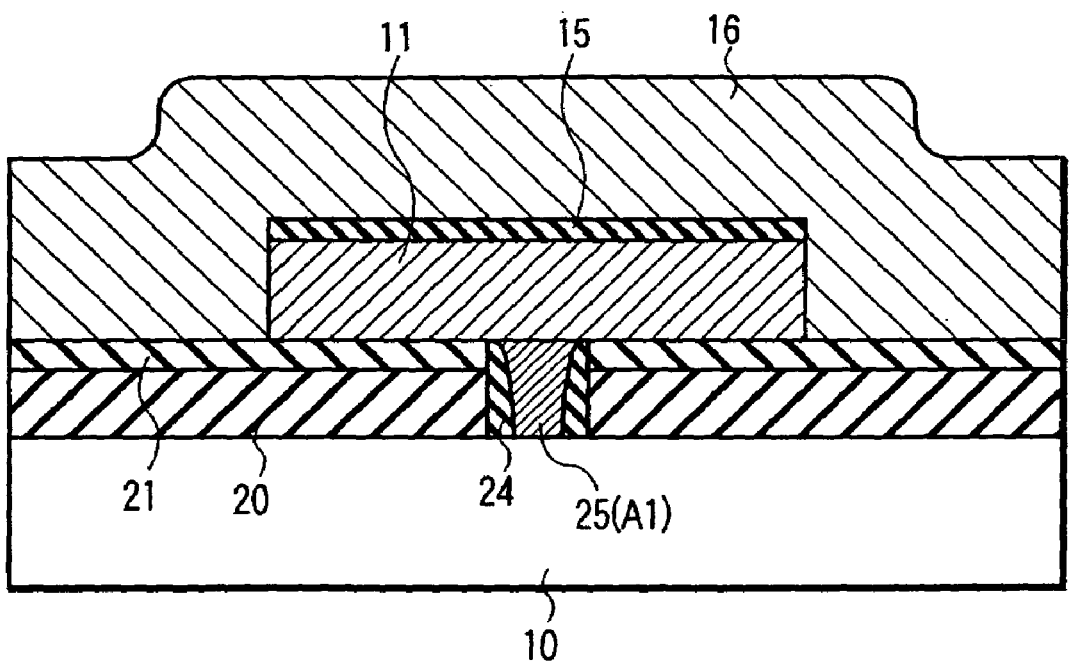
Figure 15A:
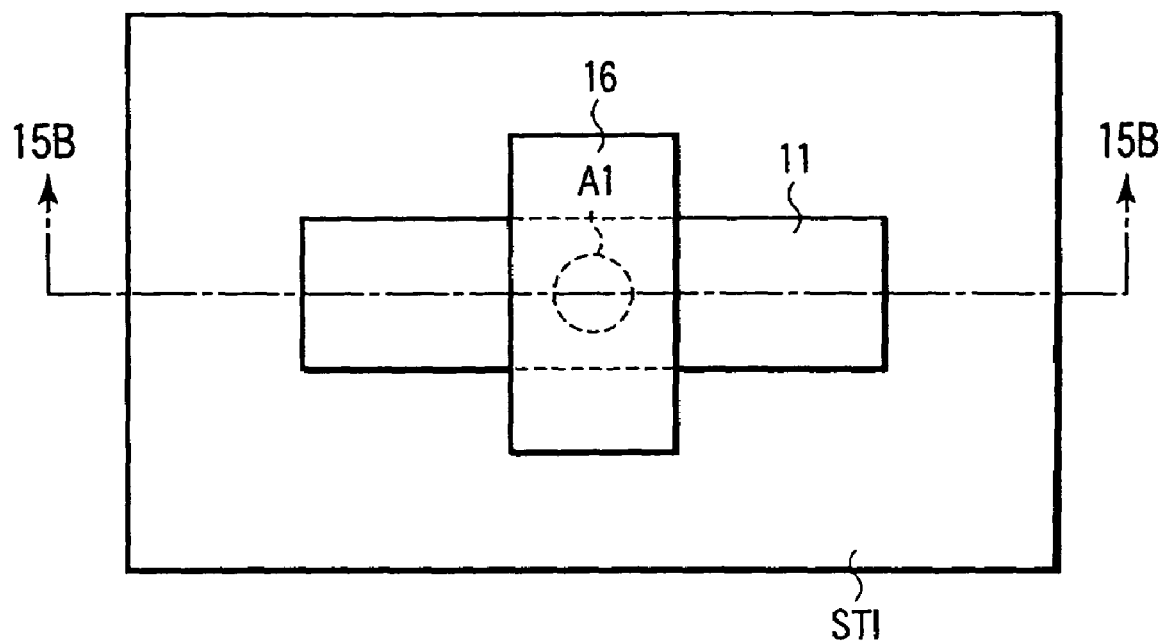
FIG. 15A is a plan view of the 12th step in fabricating the semiconductor device according to the first embodiment of the present invention.
Figure 15B:
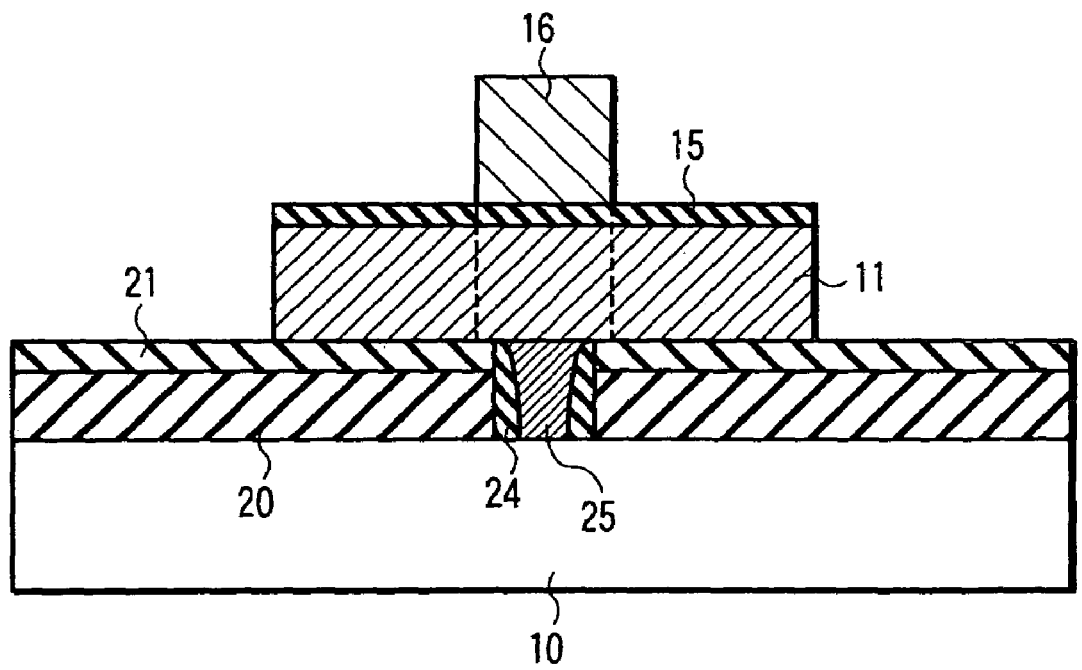
FIG. 15B is a sectional view taken along a line 15B-15B in FIG. 15A.

As shown in FIG. 14, a polysilicon film 16 is formed on the silicon nitride film 21 and gate insulating film 15 by, e.g., CVD. The polysilicon film 16 has an excellent step coverage and is therefore formed to surround the fin-shaped silicon layer 11.

As shown in FIGS. 15A and 15B, the polysilicon film 16 is patterned into a pattern shown in FIGS. 15A and 15B by photolithography and etching. As a result, the gate electrode 16 is completed. The gate electrode 16 is formed to stride over almost the central portion of the silicon layer 11, i.e., the region where the channel region is to be formed. In other words, the silicon layer 25 is located immediately under the region where the silicon layer 11 and gate electrode 16 overlap.

After that, the silicon layer 11 is doped with an impurity by ion implantation or the like. With this process, the source region 12 and drain region 13 are formed in the silicon layer 11. The gate electrode 16 is also doped with an impurity. With the above processes, the fin MOS transistor shown in FIGS. 2 to 3C is completed.

Figure 1:
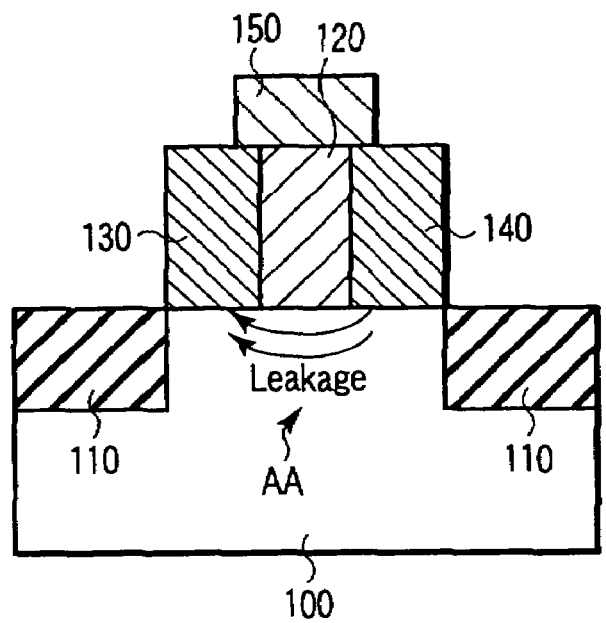
FIG. 1 is a sectional view of a conventional semiconductor device.

According to the structure and fabricating method of this embodiment, a leakage current flowing in the fin MOS transistor can effectively be reduced. This will be described with reference to FIG. 3B. As shown in FIG. 3B, the insulating film STI is formed in a region under the source region 12 and drain region 13. That is, the source region 12 and drain region 13 are isolated from the silicon substrate 10 by the insulating film STI. Hence, unlike the conventional structure described with reference to FIG. 1, in the structure according to the first embodiment, no leakage current path from the source region 12 to the drain region 13 through the silicon substrate 10 is present. The only path that exists is the path that flows from the source region 12 to the drain region 13 through the channel region 14. This path is present in the region that can sufficiently be controlled by the gate electrode. Hence, the leakage current controllability can be improved, and the leakage current can be reduced, as compared to the prior art.

Additionally, according to the fabricating method of this embodiment, formation of a leakage current path through the silicon substrate 10 can effectively be prevented. As described above, the connection region A1 is formed in accordance with the following procedure. First, a hole 23 is formed (FIG. 5B).

An insulating film 24 is formed on the inner sidewall of the hole 23 (FIGS. 6 and 7). Then, the hole 23 is filled with a silicon layer 25 (FIG. 8). The gate electrode 16 is formed to overlap the connection region A1 formed in the above way. A source region 12 and drain region 13 are formed by ion implantation using the gate electrode 16 as a mask. Normally, the gate electrode 16 is formed to have a width corresponding to the minimum process size. The diameter of the hole 23 is smaller than the minimum process size because the insulating film 24 is formed on the sidewall. The gate electrode 16 is formed to overlap the hole 23. The insulating film 24 is formed to a thickness larger than the misalignment in forming the gate electrode 16. Hence, even if misalignment occurs between the gate electrode 16 and the hole 23 at the time of forming the gate electrode 16 by patterning the polysilicon layer 16, the gate electrode 16 and hole 23 completely overlap. That is, as shown in the plan view of FIG. 15A, the connection region A1 is completely covered with the gate electrode. As a consequence, the source region 12 and drain region 13 that are formed using the gate electrode 16 as a mask do not come into contact with the connection region A1. The end portions of the source region 12 and drain region 13 are located on the insulating film STI. For this reason, even when misalignment occurs during photo-lithography in forming the gate electrode 16, formation of any leakage current path from the source region 12 to the drain region 13 through the silicon substrate 10 can be prevented.

Figure 16:
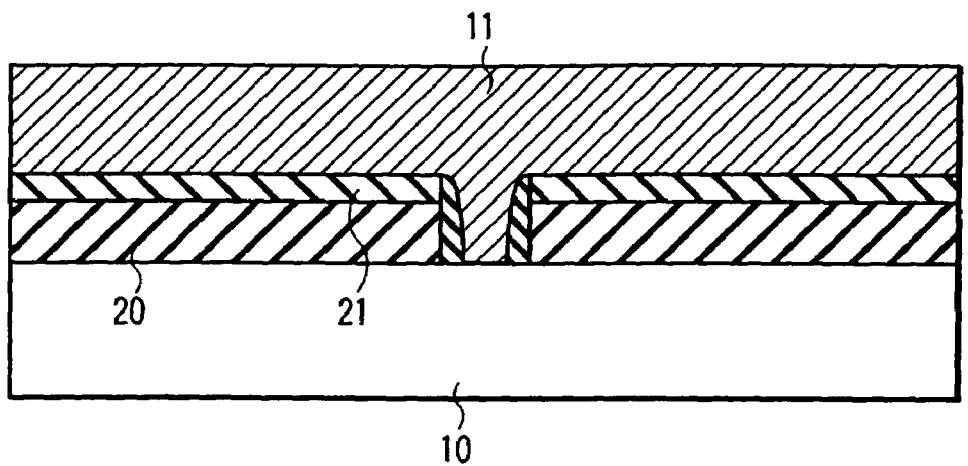
FIG. 16 is a sectional view of part of a step in fabricating the semiconductor device according to a modification to the first embodiment of the present invention.

In the above embodiment, the silicon layers 25 and 11 are formed in separate steps. However, as shown in the sectional view of FIG. 16, after the sidewall insulating film 24 is formed, the amorphous silicon layer 11 may be formed on the silicon nitride film 21 and in the hole 23 to fill the hole 23. In this case as well, after formation of the silicon layer 11, it is crystallized into single crystal by annealing.

In the above embodiment, the insulating film STI is formed from the silicon oxide films 20 and 24 and silicon nitride film 21. However, after the insulating film 24 is formed, the silicon nitride film 21 may be appropriately removed to make the insulating film STI formed from the silicon oxide films 20 and 24.

A semiconductor device according to the second embodiment of the present invention and a method for fabricating the semiconductor device will be described next with reference to FIGS. 17 to 25. In this embodiment, the structure shown in FIGS. 2 to 3C described in the first embodiment is formed using an SOI (Silicon On Insulator) substrate. FIGS. 17 to 25 are sectional views sequentially showing steps in fabricating a fin MOS transistor according to the second embodiment.

Figure 17:
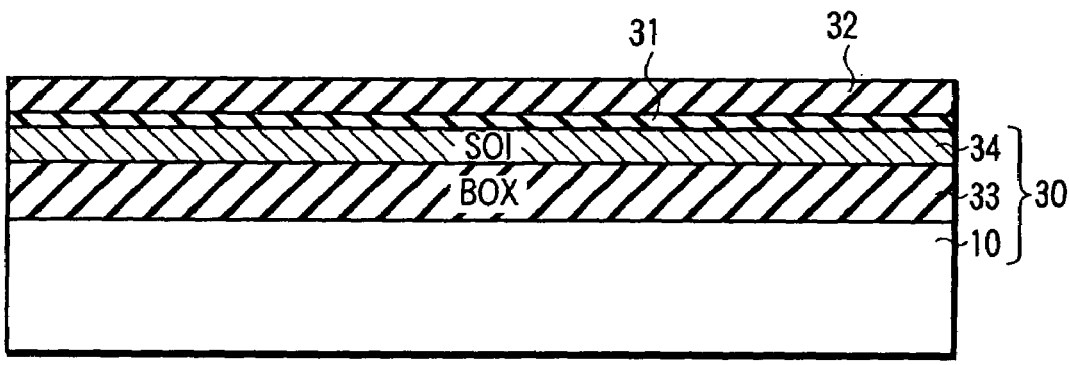

First, as shown in FIG. 17, a silicon oxide film 31 having a thickness of about 50 Å is formed on an SOI substrate 30 by thermal oxidation or the like. Subsequently, a silicon nitride film 32 having a thickness of about 300 Å is formed on the silicon oxide film 31 by CVD or the like. The SOI substrate 30 has a silicon substrate 10, a silicon oxide film (BOX layer: Buried OXide layer) 33 having a thickness of about 1,000 Å and formed on the silicon substrate 10, and a silicon layer (SOI layer) 34 having a thickness of about 500 Å and formed on the silicon oxide film 33. The SOI substrate 30 may be formed either by bonding two silicon substrates or by SIMOX (Separation by IMplanted OXygen).

Figure 18:
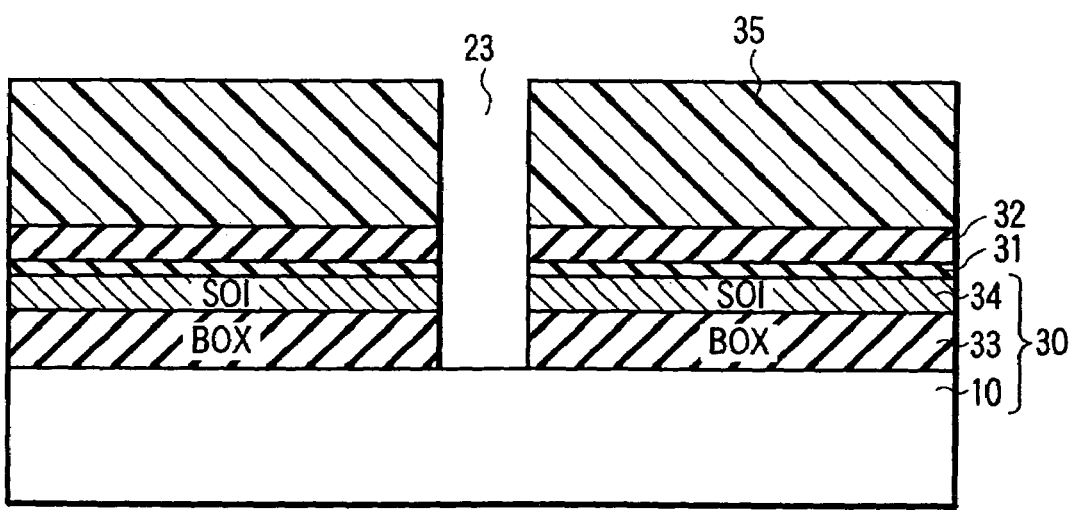

As shown in FIG. 18, a photoresist 35 is applied onto the silicon nitride film 32. The photoresist 35 is patterned into a pattern as shown in FIG. 18 by photolithography. The photoresist pattern is the same as that shown in FIG. 5A described in the first embodiment. The silicon nitride film 32, silicon oxide film 31, silicon layer 34, and silicon oxide film 33 are etched by RIE or the like using the photoresist 35 as a mask. As a result, a hole 23 as shown in FIG. 18 is formed. The silicon substrate 10 is exposed to the bottom surface of the hole 23. The hole 23 is used to form a connection region A1 described with reference to FIGS. 2 to 3C. The hole 23 is so formed that its diameter equals the minimum process size of photolithography.

Figure 19:
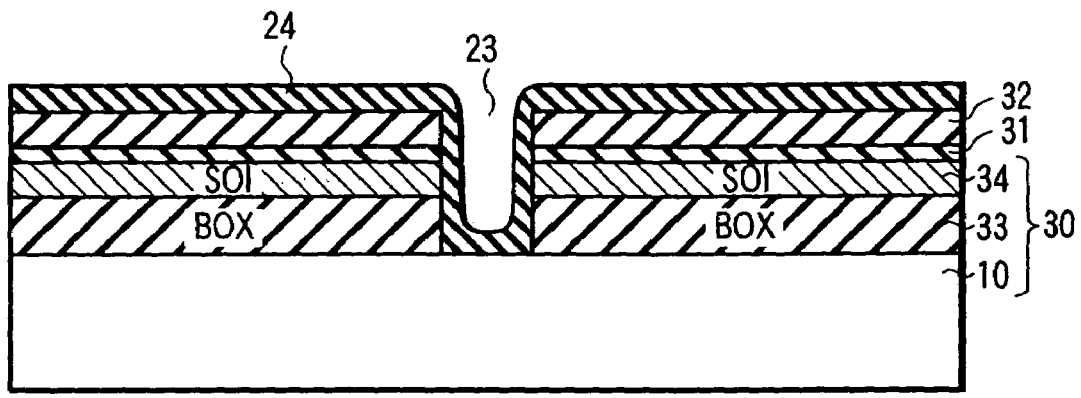

The photoresist 35 is removed by ashing or the like. Then, as shown in FIG. 19, a silicon oxide film 24 having a thickness of about 300 Å is formed on the silicon nitride film 23 and in the hole 23 by, e.g., LPCVD. This step is the same as that described in the first embodiment with reference to FIG. 6.

Figure 20:
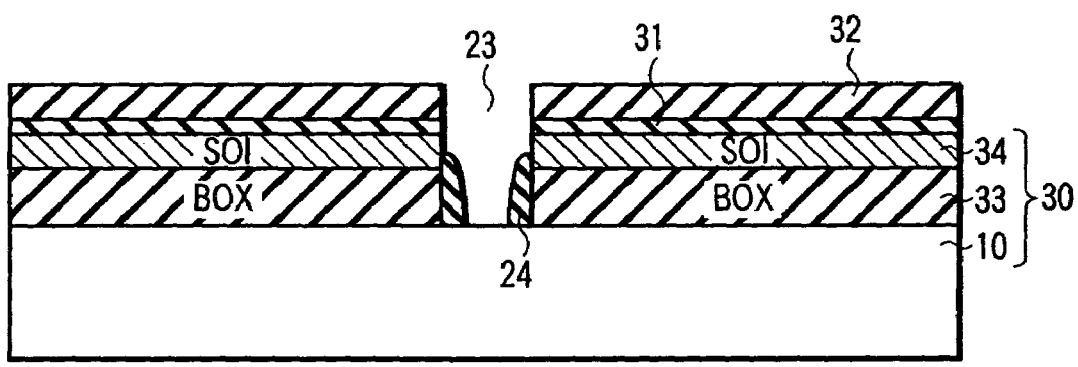

With the step described in the first embodiment with reference to FIG. 7, the silicon oxide film 24 is left only on the sidewall of the hole 23. As a result, the structure shown in FIG. 20 is obtained. After that, the silicon nitride film 32 is removed by wet etching using an etchant such as $H_3PO_4$. Subsequently, the silicon oxide film 31 on the silicon layer 34 is removed. In this embodiment, an insulating film STI is formed from the silicon oxide films 24 and 33.

Figure 21:
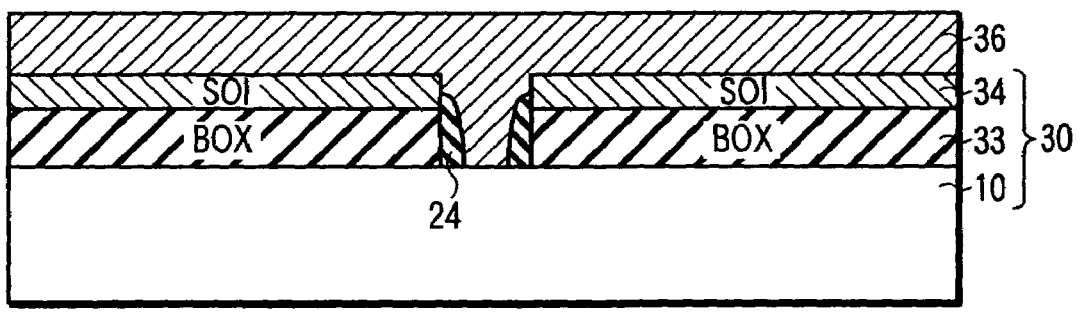

As shown in FIG. 21, an amorphous silicon layer 36 having a thickness of about 500 Å is formed on the silicon layer 34 and in the hole 23. The amorphous silicon layer 36 is crystallized into single crystal by annealing for a long time in an atmosphere suitable for the growth of silicon crystal. In the hole 23, the amorphous silicon layer 36 is formed from the bottom and side surfaces. Consequently, the hole 23 is filled. Hence, the amorphous silicon layer 36 in and above the hole 23 may have a number of crystal defects. In such a case, inert ions such as Ar ions or an element such as Ge (an element that can remain in the silicon substrate without any problem) is implanted into the amorphous silicon layer 36 by ion implantation. Then, annealing is preferably performed to re-crystallize the amorphous silicon layer 36 to increase the crystallinity.

As shown in FIG. 22, a silicon oxide film 26 is formed on the silicon layer 36. A photoresist 27 is applied onto the silicon oxide film 26 and then patterned, as shown in FIG. 22, by photolithography. This photoresist pattern is the formation pattern of a semiconductor layer 11 shown in FIGS. 2 to 3C.

As shown in FIG. 23, the silicon oxide film 26 and silicon layers 36 and 34 are etched by RIE or the like using the photoresist 27 as a mask. The photoresist 27 is removed by ashing or the like. The silicon oxide film 26 is removed by etching using an HF-based etchant. As a result, a fin-shaped silicon layer 11 as shown in FIG. 23 is formed. The silicon layer 11 according to the second embodiment includes the silicon layers 34 and 36. The region where the silicon layer 11 and silicon substrate 10 are in contact with each other almost at the central portion of the silicon layer 11 is a connection region A1. The planar structure corresponding to FIG. 23 is the same as that shown in FIG. 12A described in the first embodiment.

Then, the same steps as in the first embodiment are executed. More specifically, as shown in FIG. 24, a gate insulating film 15 is formed on the surface of the silicon layer 11. As shown in FIG. 25, a gate electrode 16 is formed. The gate electrode 16 is formed to stride over almost the central portion of the silicon layer 11 (the region where the channel region is to be formed). The connection region A1 is located immediately under the region where the silicon layer 11 and gate electrode 16 overlap. After that, a source region 12 and drain region 13 are formed in the silicon layer 11, thus completing the fin MOS transistor shown in FIGS. 2 to 3C.

According to the above fabricating method, the structure described in the first embodiment can be obtained using an SOI substrate, and the same effect as in the first embodiment can be obtained. In addition, the silicon layer 11 and silicon substrate 10 are electrically connected in the connection region A1. Hence, no floating body effect is generated although the SOI substrate is used. Hence, the operation reliability of the MOS transistor can be increased.

In the above embodiment, the hole 23 is filled with the silicon layer 36. However, as shown in FIGS. 26 and 27, this step may be divided into two steps. More specifically, as shown in FIG. 26, a silicon layer 25 is selectively formed in the hole 23 by the method described in the first embodiment. Then, as shown in FIG. 27, the silicon layer 36 may be formed on the silicon layers 34 and 25.

A semiconductor device according to the third embodiment of the present invention and a method for fabricating the semiconductor device will now be described. In this embodiment, the fin MOS transistor according to the first embodiment is applied to a cell transistor of a DRAM (Dynamic Random Access Memory).

Figure 28A:
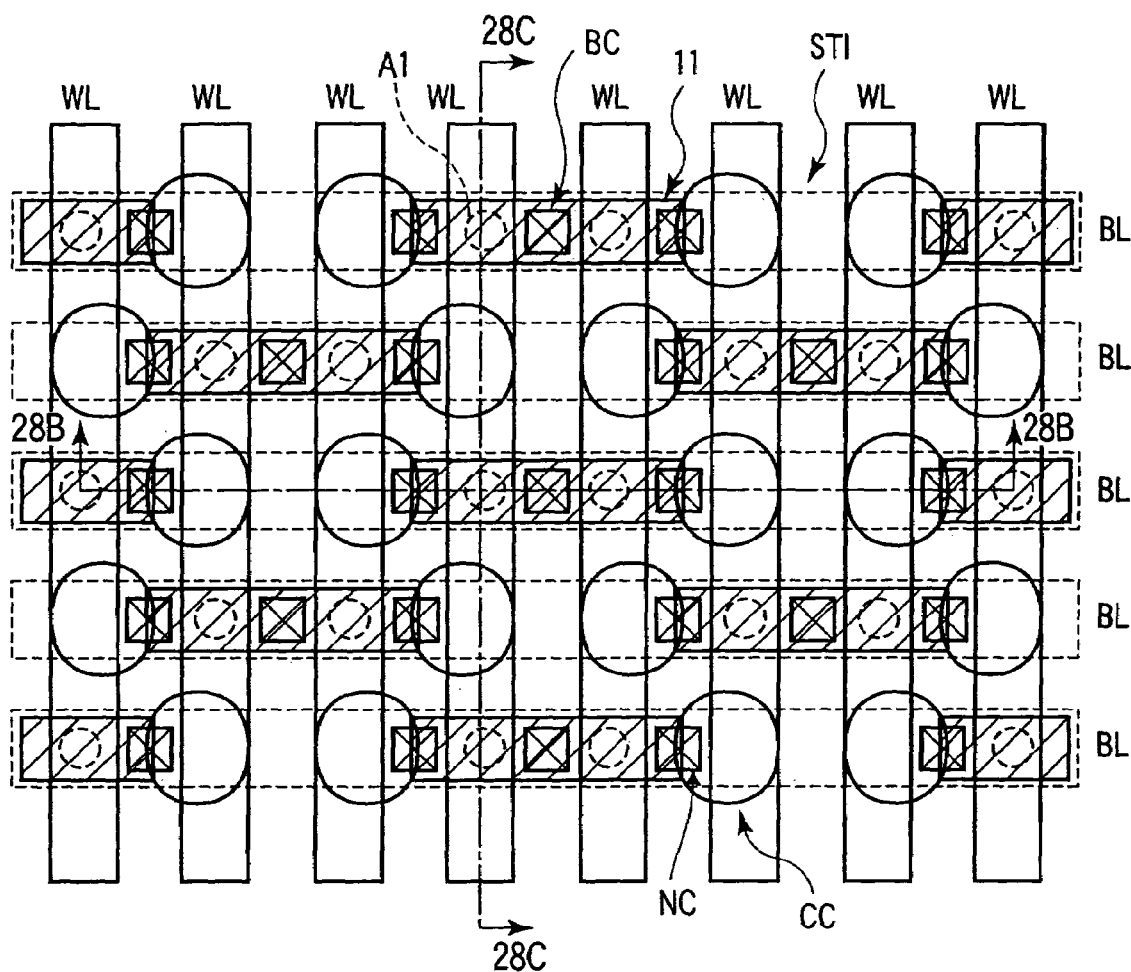
FIG. 28A is a plan view of a semiconductor device according to the third embodiment of the present invention.

The planar structure of the DRAM will be described first with reference to FIG. 28A. FIG. 28A is a plan view of a DRAM cell array according to the third embodiment.

As shown in FIG. 28A, a plurality of fin-shaped silicon layers 11 are laid out in a staggered pattern on an insulating film STI formed in a silicon substrate. Hatched regions in FIG. 28A indicate the silicon layers 11. Stripe-shaped word lines WL are formed in a direction perpendicular to the longitudinal direction of the silicon layers 11. The word lines WL are formed across a plurality of silicon layers 11. Two word lines WL pass on one silicon layer 11. The word lines WL and the source and drain regions (not shown) formed in the silicon layer 11 form a cell transistor. Trench-shaped cell capacitors CC are formed at two end portions of the silicon layer 11 in the longitudinal direction. The source regions in the silicon layer 11 and the cell capacitors CC are electrically connected through node contacts NC. The cell transistors and cell capacitors form the memory cells of the DRAM. Cell transistors located on the same column are connected to a same word line WL. In addition, a plurality of bit lines BL each of which is electrically connected to memory cells located on the same row through bit line contacts BC are formed in the longitudinal direction of the silicon layers 11.

In the region where the silicon layer 11 and the word line WL overlap, the insulating film STI is removed to form a connection region A1. This connection region A1 electrically connects the fin-shaped silicon layer 11 and the silicon substrate.

Figure 28B:
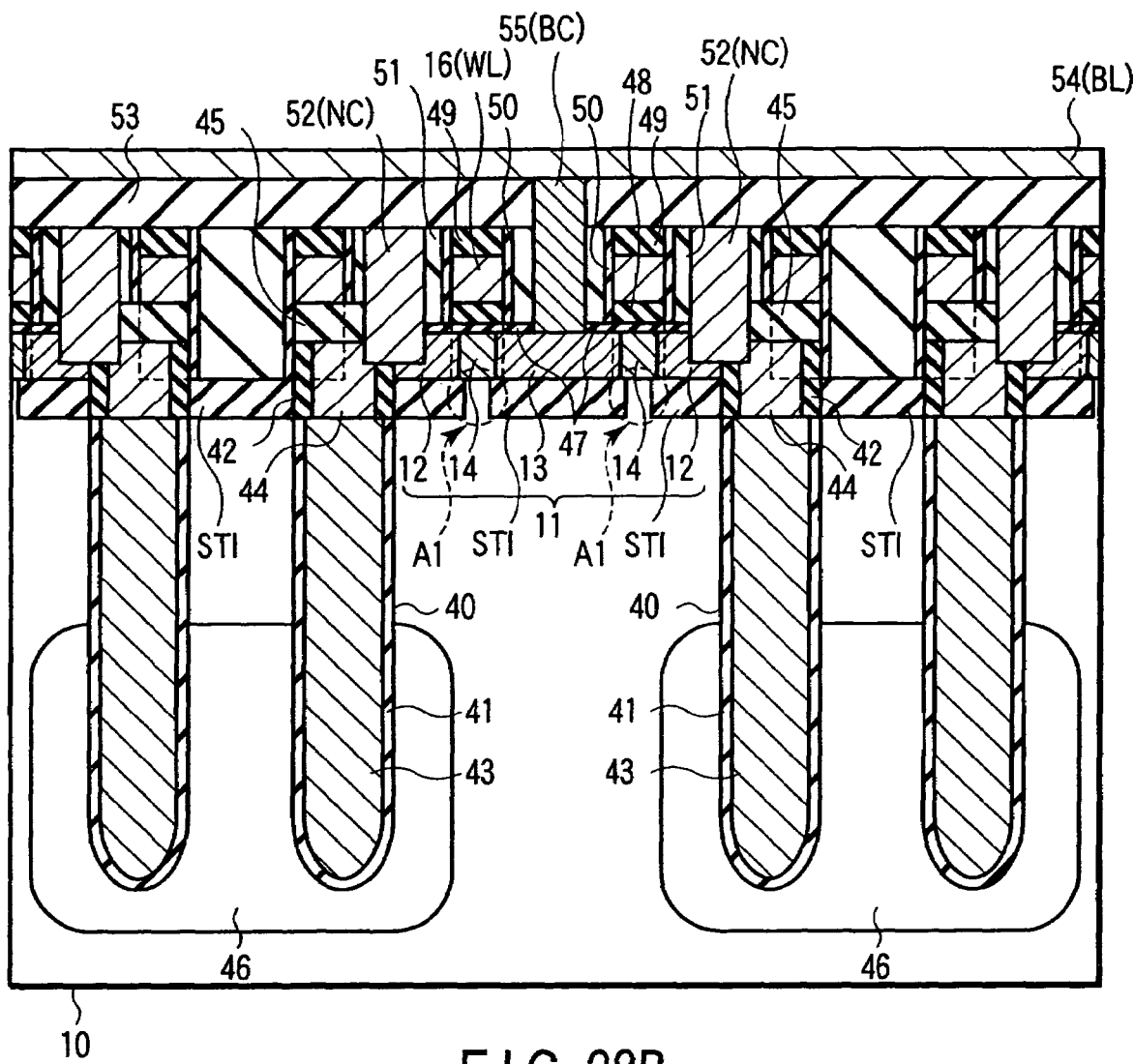
FIG. 28B is a sectional view taken along a line 28B-28B in FIG. 28A.
Figure 28C:
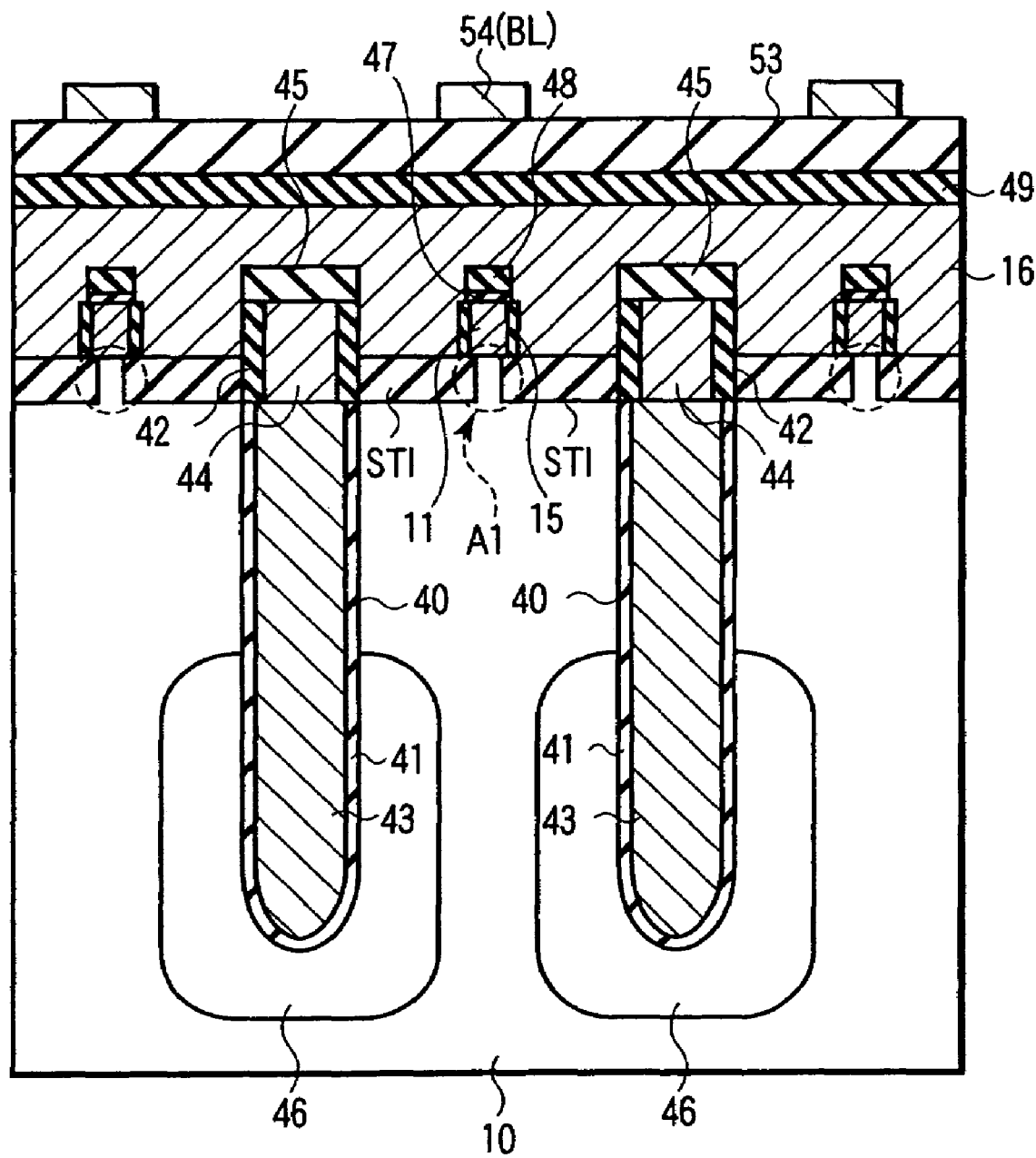
FIG. 28C is a sectional view taken along a line 28C-28C in FIG. 28A.

The sectional structure of the above DRAM cell array will be described next with reference to FIGS. 28B and 28C. FIGS. 28B and 28C are sectional views taken along lines 28B-28B and 28C-28C in FIG. 28A, respectively.

As shown in FIGS. 28B and 28C, the insulating film STI is formed in the surface of a p-type silicon substrate 10. The fin-shaped silicon layer 11 is formed on the insulating film STI. Trenches 40 which are to be used to form the cell capacitors CC are formed to run from the surface of the fin-shaped silicon layer 11 into the silicon substrate 10. A capacitor insulating film 41 is formed on the inner surface of each trench 40 except at its upper portion. A collar oxide film 42 thicker than the capacitor insulating film 41 is formed on the inner surface at the upper portion of each trench 40. A storage node electrode 43 is formed in each trench 40 to fill it halfway. A conductive layer 44 is formed on the storage node electrode 43. An insulating film 45 is formed on the collar oxide film 42 and conductive layer 44 at the opening portion of each trench 40 to cover the upper surface of the conductive layer 44. N$^+$-type impurity diffusion layers 46 are formed in the silicon substrate 10 to be in contact with the capacitor insulating films 41. The n$^+$-type impurity diffusion layer 46 functions as a plate electrode. In this way, the trench-shaped cell capacitors CC are formed.

The fin-shaped silicon layer 11 is in contact with the cell capacitors CC at the two ends in the longitudinal direction. As shown in FIG. 28B, a source region 12, drain region 13, and channel region 14 are formed in the silicon layer 11. A gate electrode 16 is formed on the upper surface of the silicon layer 11 with insulating films 47 and 48 interposed therebetween and on the side surface of the silicon layer 11 with a gate insulating film 15 interposed therebetween.

In a region immediately under the channel region 14, the insulating film STI is removed. This region is a connection region A1. In the connection region A1, the silicon substrate 10 and channel region 14 are electrically connected. The insulating film STI is formed in regions immediately under the source region 12 and drain region 13. The source region 12, drain region 13, and silicon substrate 10 are isolated by the insulating film STI.

Insulating films 49, 50, and 51 are formed around the gate electrode 16. A contact plug 52 serving as the node contact NC is formed in the insulating film 51. The node contact plug 52 electrically connects the source region 12 of the cell transistor and the conductive layer 44 of the cell capacitor CC. An insulating film 53 is formed to cover the gate electrode 16 and node contact plug 52. A metal interconnection layer 54 serving as the bit lines BL is formed on the insulating film 53. The metal interconnection layer 54 is electrically connected to the drain region 13 of the cell transistor through a contact plug 55 serving as the bit line contact plug BC.

Figure 29A:
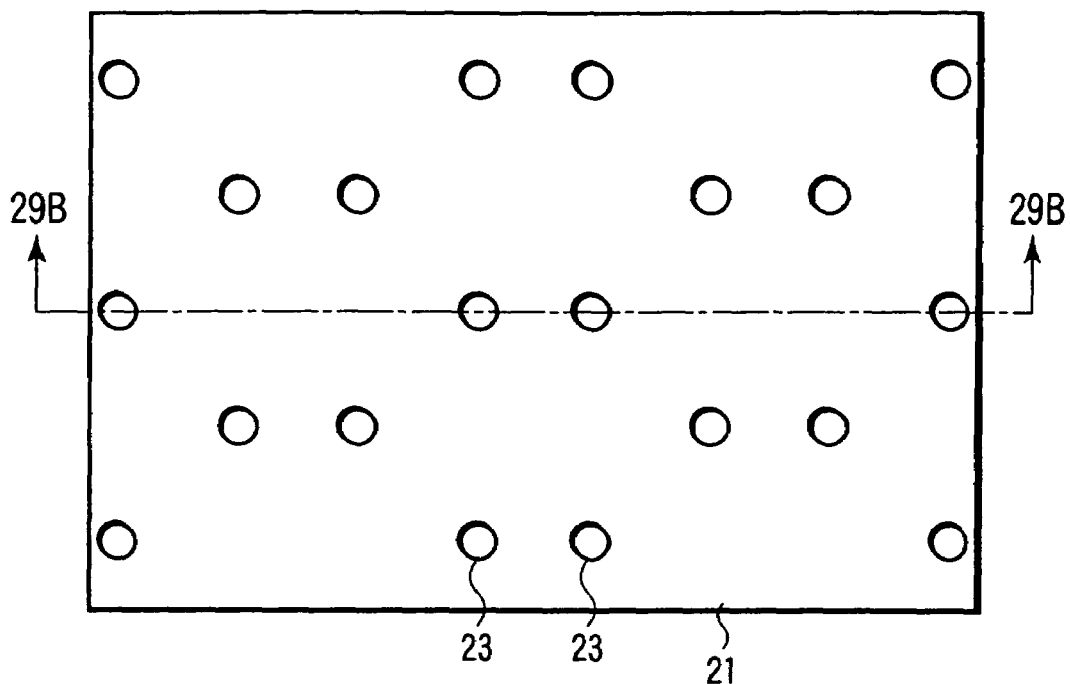
FIG. 29A is a plan view of the first step in fabricating the semiconductor device according to the third embodiment of the present invention.
Figure 29B:
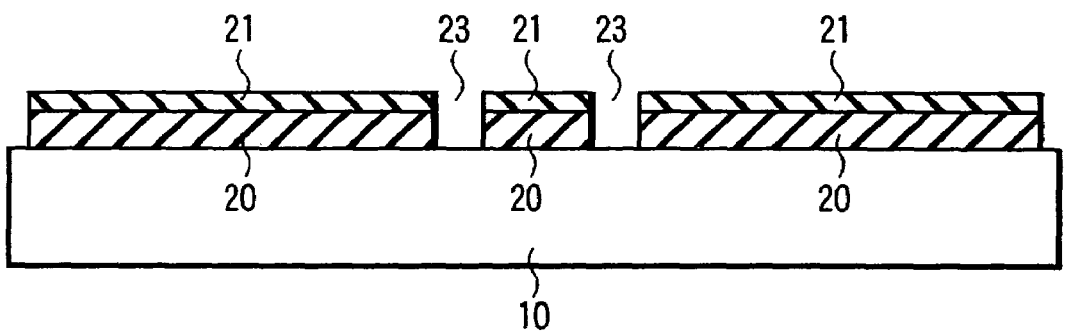
FIG. 29B is a sectional view taken along a line 29B-29B in FIG. 29A.
Figure 35A:
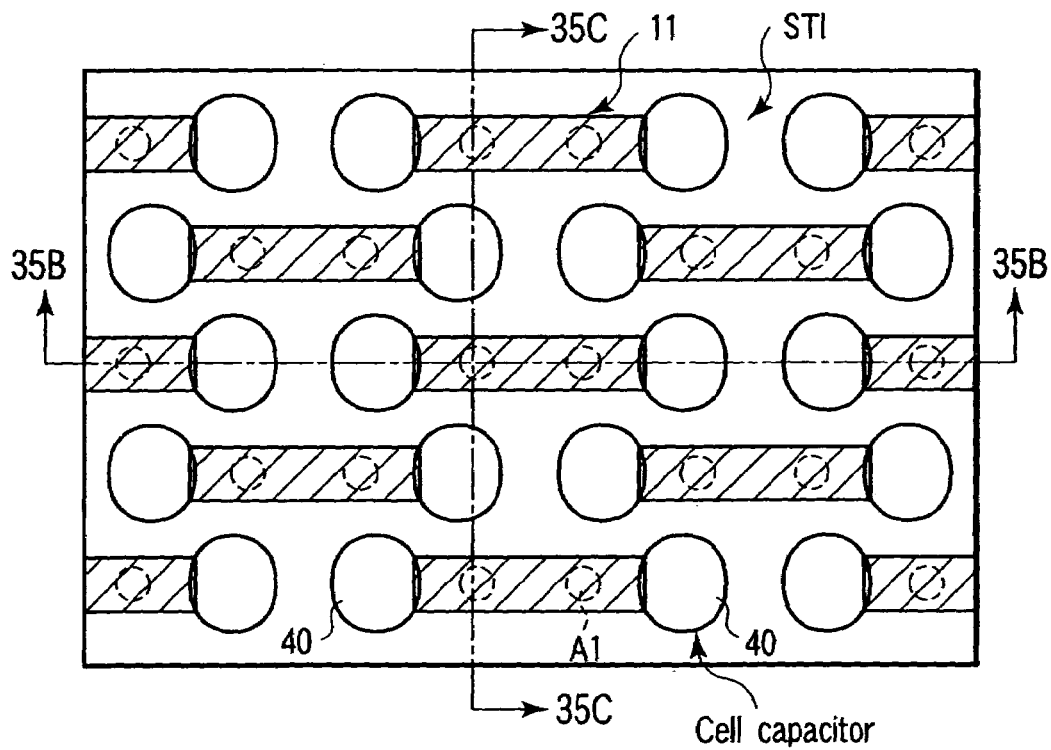
FIG. 35A is a plan view of the seventh step in fabricating the semiconductor device according to the third embodiment of the present invention.
Figure 35B:
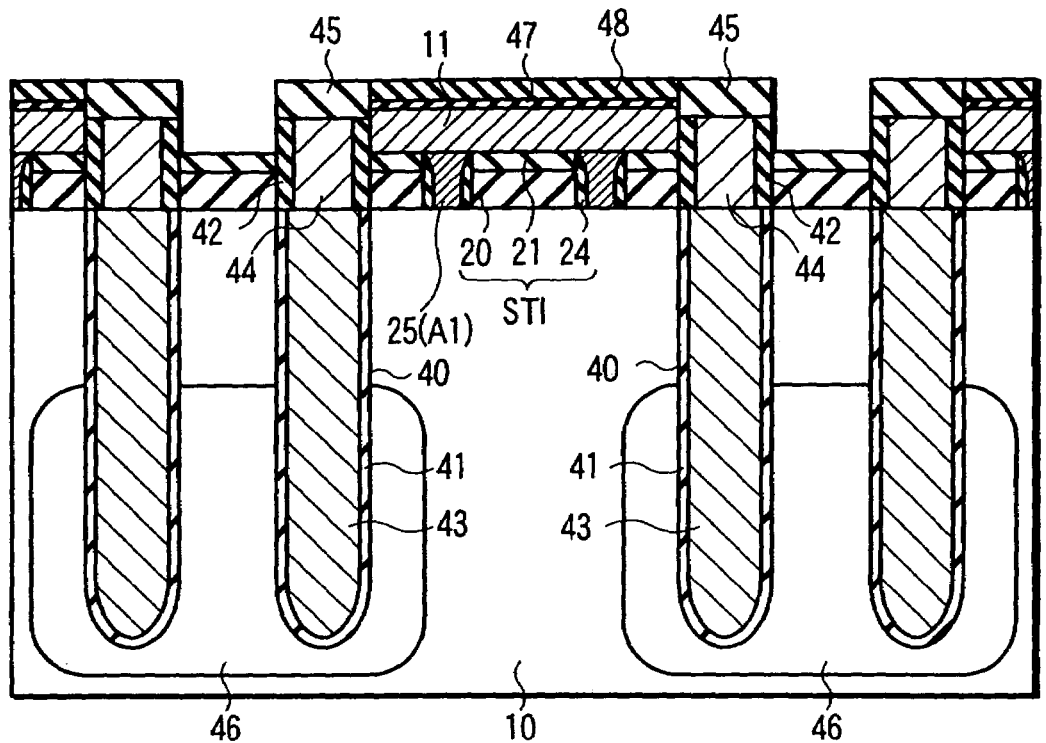
FIG. 35B is a sectional view taken along a line 35B-35B in FIG. 35A.
Figure 35C:
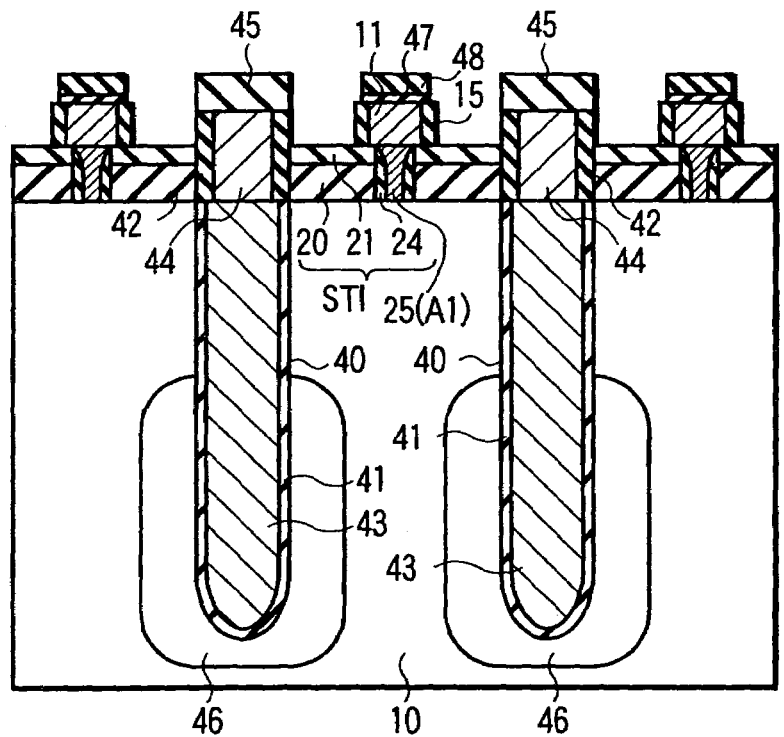
FIG. 35C is a sectional view taken along a line 35C-35C in FIG. 35A.
Figure 36A:
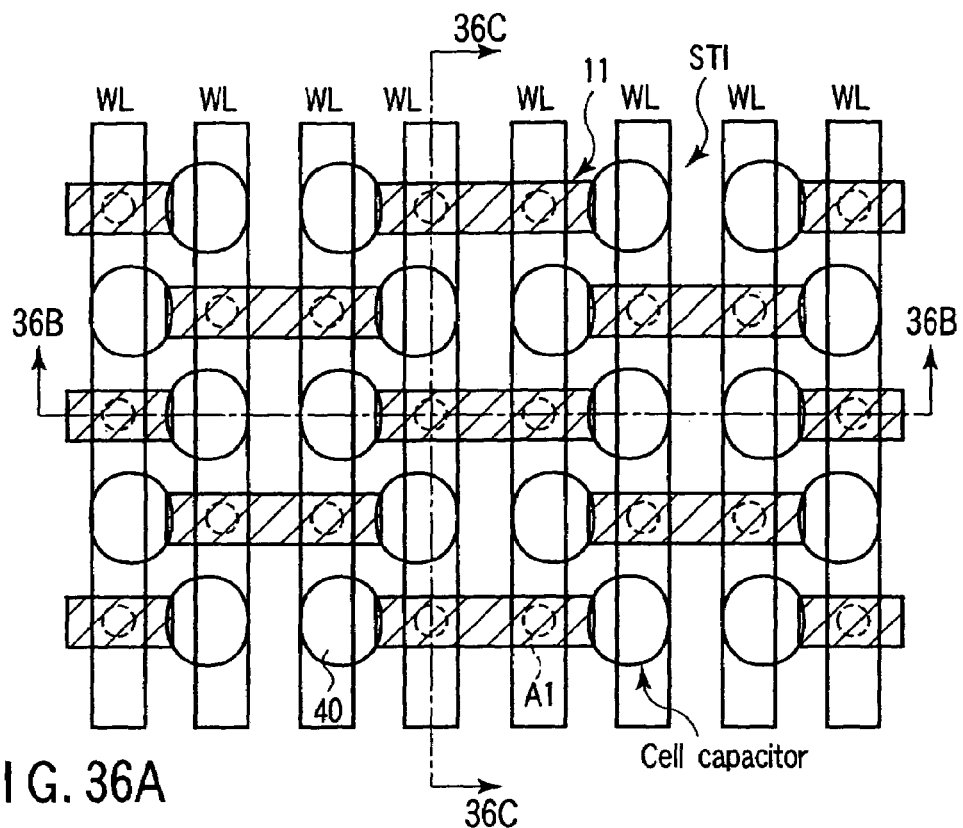
FIG. 36A is a plan view of the eighth step in fabricating the semiconductor device according to the third embodiment of the present invention.
Figure 36B:
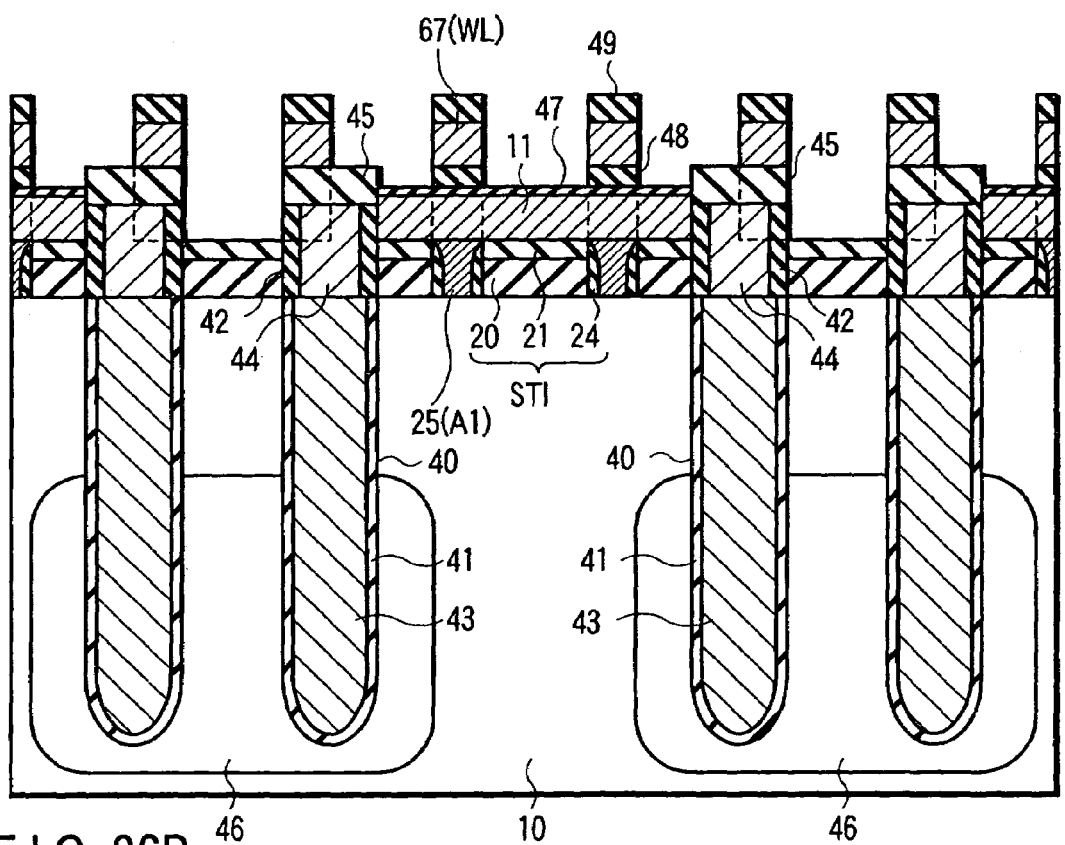
FIG. 36B is a sectional view taken along a line 36B-36B in FIG. 36A.
Figure 36C:
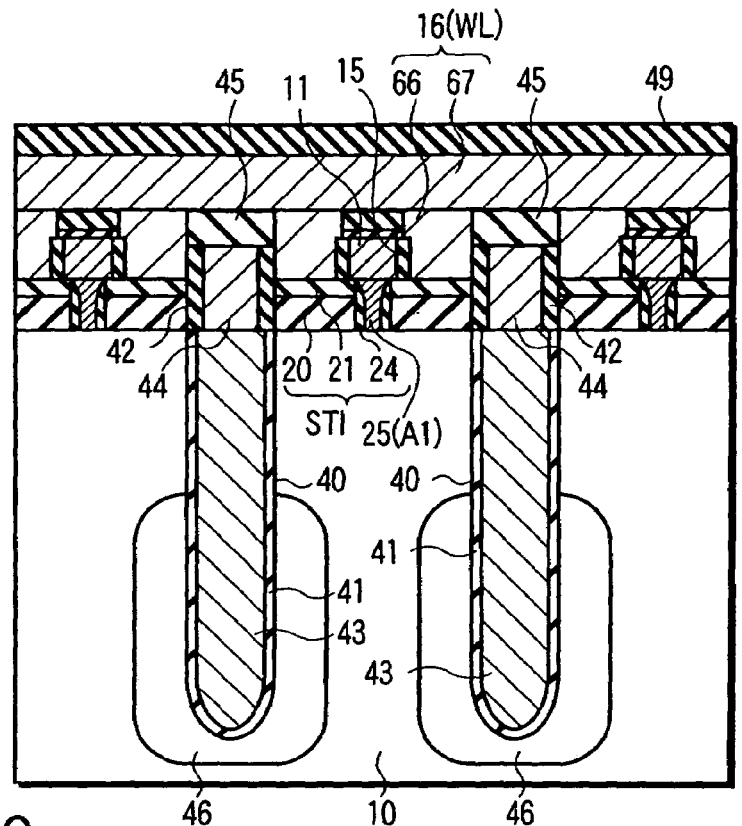
FIG. 36C is a sectional view taken along a line 36C-36C in FIG. 36A.

A method for fabricating a DRAM having the above structure will be described next with reference to FIGS. 29A, 29B, 30, 31A, 31B, 32 to 34, 35A to 35C, 36A to 36C, 37, and 38. FIGS. 29A and 29B, 30, 31A and 31B, 32 to 34, 35A to 35C, 36A to 36C, 37, and 38 sequentially show steps in fabricating the DRAM according to the third embodiment. FIGS. 29A, 31A, 35A, and 36A are plan views. FIGS. 29B, 30, 31B, 32 to 34, 35B, 35C, 36B, 37, and 38 are sectional views. FIG. 29B is a sectional view taken along a line 29B-29B in FIG. 29A. FIG. 31B is a sectional view taken along a line 31B-31B in FIG. 31A. FIG. 35B is a sectional view taken along a line 35B-35B in FIG. 35A. FIG. 35C is a sectional view taken along a line 35C-35C in FIG. 35A. FIG. 36B is a sectional view taken along a line 36B-36B in FIG. 36A. FIG. 36C is a sectional view taken along a line 36C-36C in FIG. 36A.

First, a silicon oxide film 20 and silicon nitride film 21 are sequentially formed on a p-type silicon substrate 10 in accordance with the steps described in the first embodiment. Holes 23 are formed in the silicon oxide film 20 and silicon nitride film 21 by photolithography and etching, as shown in FIGS. 29A and 29B. As described above, each hole 23 is used to form the connection region A1 and located immediately under a region where the channel region of the cell transistor is to be formed.

Figure 30:
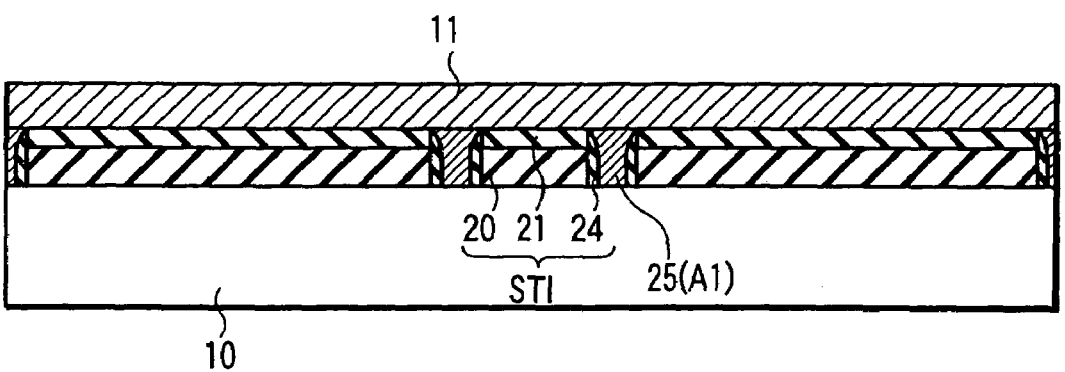
FIG. 30 is a sectional view of the second step in fabricating the semiconductor device according to the third embodiment of the present invention.

Subsequently, the structure shown in FIG. 30 is obtained by the steps shown in FIGS. 6 to 9 of the first embodiment. More specifically, a silicon oxide film 24 is formed on the sidewall of each hole 23. The hole 23 is filled with a silicon layer 25. A silicon layer 11 is formed on the silicon nitride film 21 and silicon layer 25.

Figure 31A:
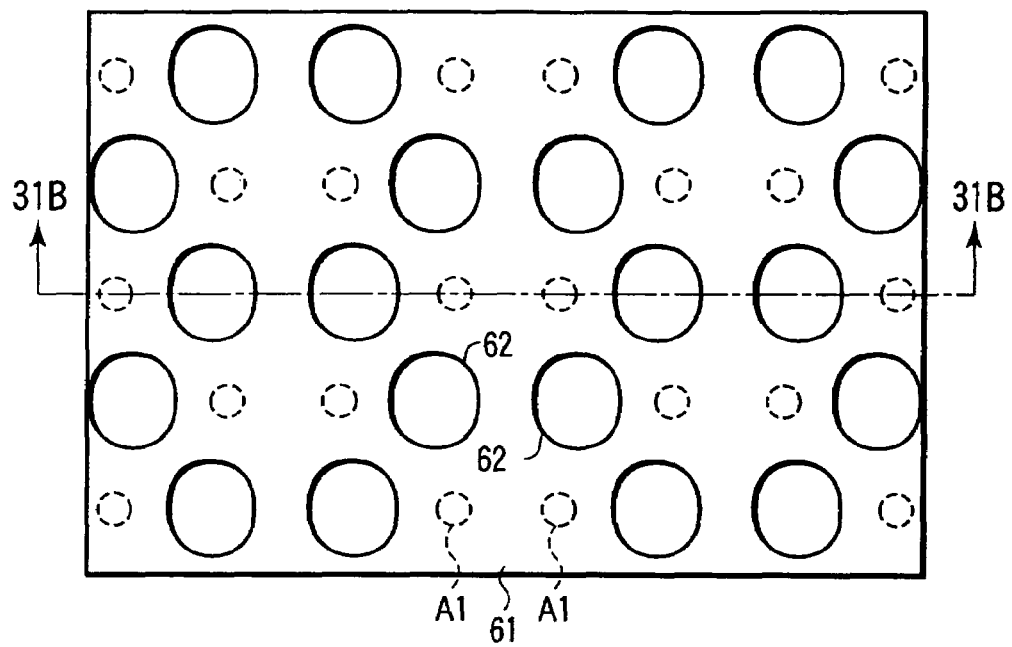
FIG. 31A is a plan view of the third step in fabricating the semiconductor device according to the third embodiment of the present invention.
Figure 31B:
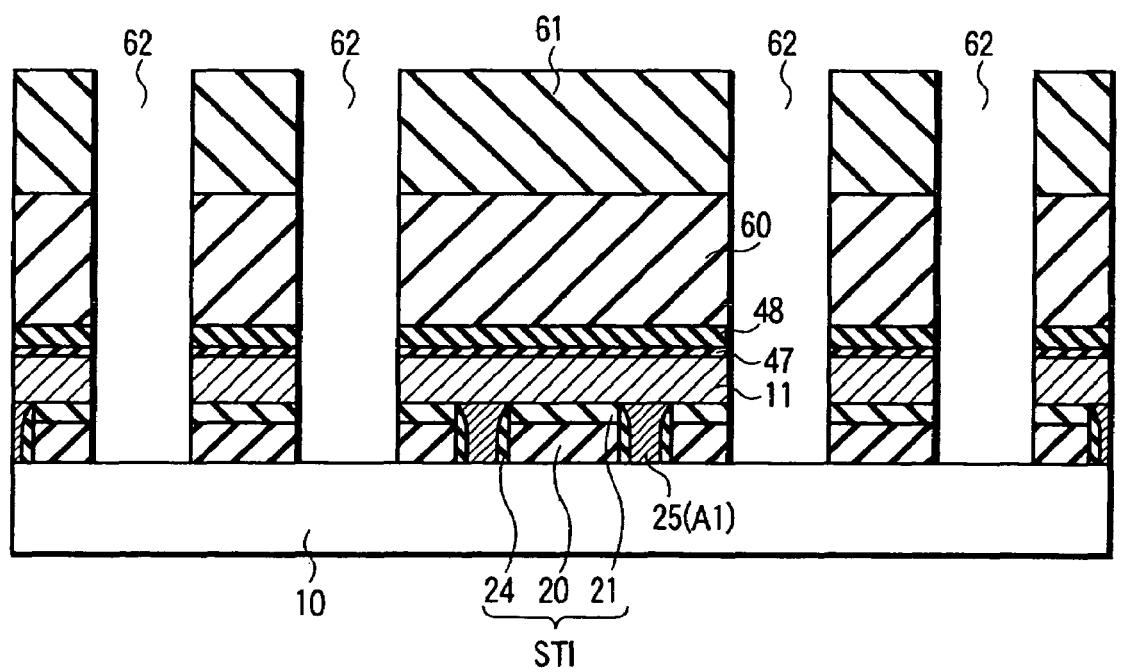
FIG. 31B is a sectional view taken along a line 31B-31B in FIG. 31A.

Next, a cell transistor is formed. First, a silicon oxide film 47 having a thickness of about 20 Å is formed on the silicon layer 11 by thermal oxidation or the like. Subsequently, a silicon nitride film 48 having a thickness of 700 Å is formed on the silicon oxide film 47 by CVD or the like. In addition, a boron-doped silicon oxide film (BSG: Boron Silicate Glass) 60 having a thickness of about 12,000 Å is formed on the silicon nitride film 48. A silicon oxide film 61 having a thickness of about 12,000 Å is formed on the silicon oxide film 60 using TEOS (tetraethylorthosilicate; Si(OC$_2$H$_5$)$_4$). A photoresist is applied onto the silicon oxide film 61 and patterned into the formation pattern of the cell capacitors CC by lithography. As shown in FIGS. 31A and 31B, the silicon oxide films 61 and 60, silicon nitride film 48, silicon oxide film 47, silicon layer 11, silicon nitride film 21, and silicon oxide film 20 are sequentially etched to form holes 62. Then, the photoresist is removed.

As shown in FIG. 32, the silicon substrate 10 is etched by RIE or the like using, as a mask, a multilayered film including the silicon oxide film 61/silicon oxide film 60/silicon nitride film 48/silicon oxide film 47. As a result, the trenches 40 as shown in FIG. 32 are formed. When the silicon substrate 10 is etched, the silicon oxide film 61 may also be removed. However, the silicon oxide film 60/silicon nitride film 48/silicon oxide film 47 must remain.

An arsenic-doped silicon oxide film (AsSG: Arsenic doped Silicate Glass) 63 having a thickness of about 300 Å is formed on the inner wall of each trench 40. A photoresist 64 is applied onto the silicon oxide film 63. The silicon oxide film 63 and photoresist 64 are recessed to a plate electrode formation region in each trench 40. A silicon oxide film 65 having a thickness of about 200 Å is formed in each trench 40 using TEOS.

Figure 33:
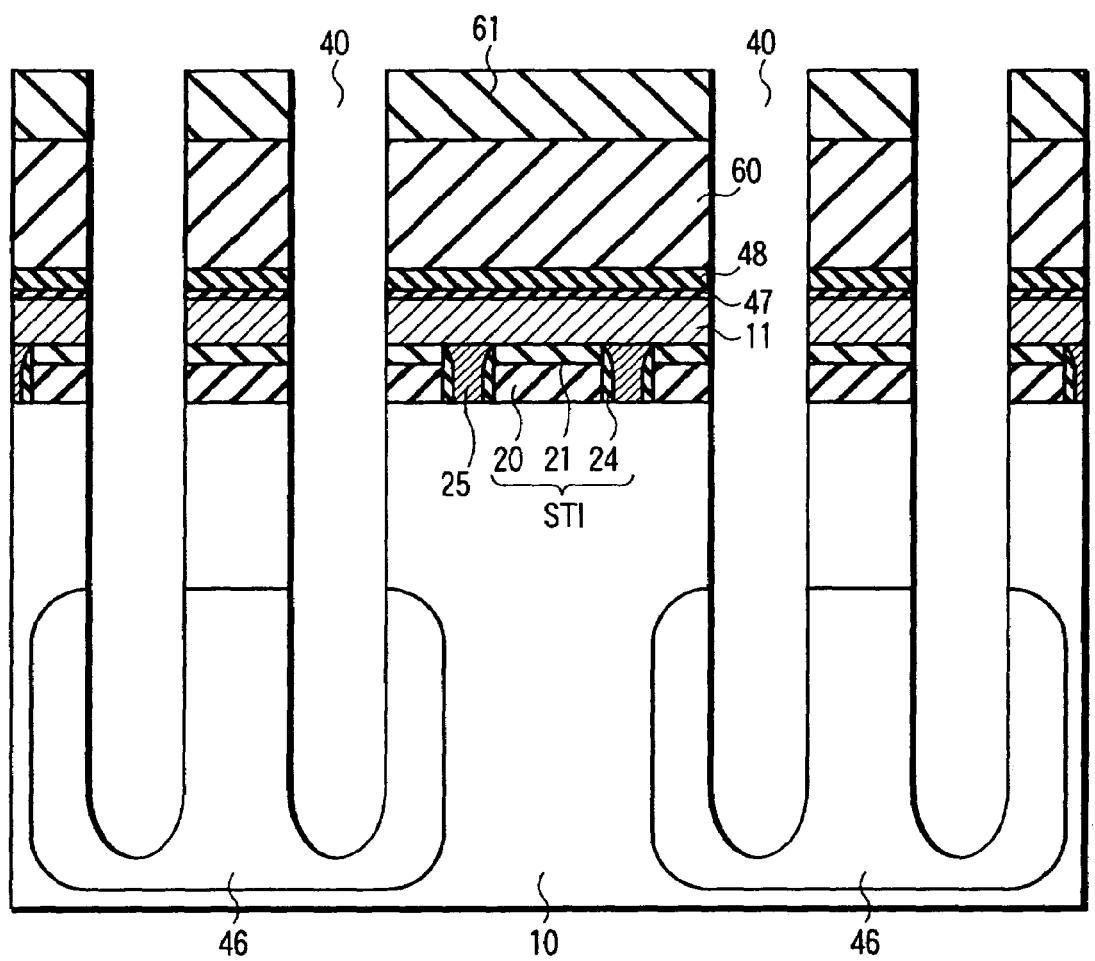

Annealing is performed at a high temperature of about 1,000° C. Then, arsenic atoms contained in the silicon oxide film 63 diffuse into the silicon substrate 10. As a result, n$^+$-type impurity diffusion layers 46 each functioning as a plate electrode are formed in the silicon substrate 10, as shown in FIG. 33. The impurity concentration of the n$^+$-type impurity diffusion layer 46 is, e.g., about $10^{20}/cm^3$. After that, the silicon oxide films 63 and 65 and photoresist 64 in each trench are removed.

Figure 34:
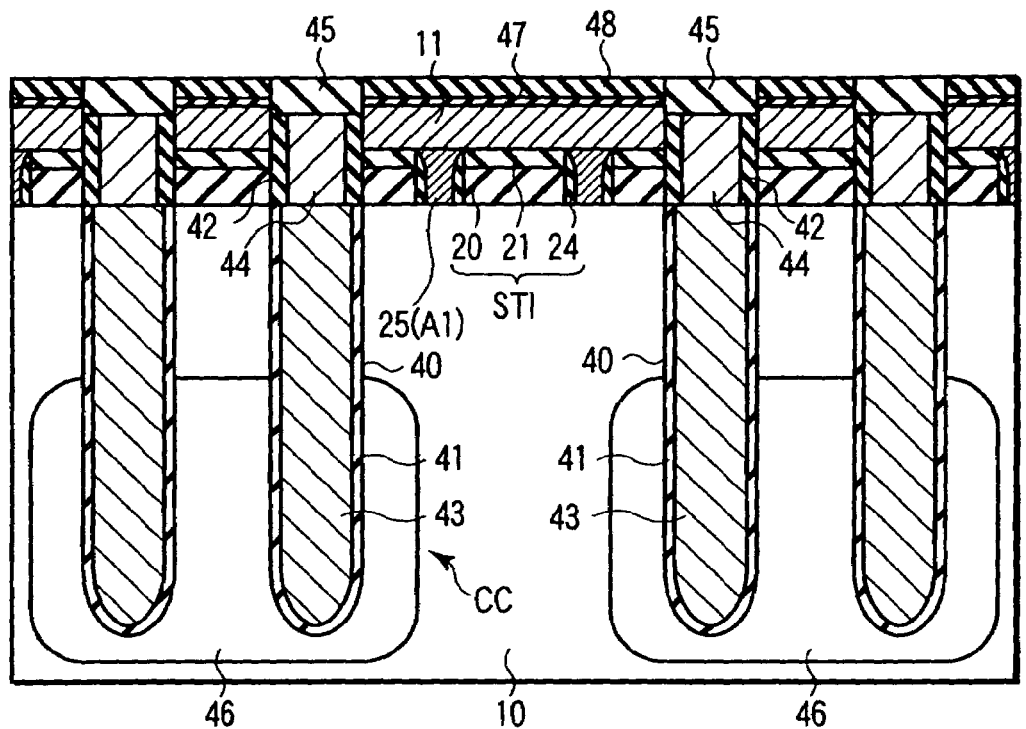

As shown in FIG. 34, a silicon nitride film having a thickness of about 80 Å is formed on the inner wall of each trench 40 by, e.g., CVD. The surface of the silicon nitride film is oxidized. As a result, a NO (Nitride-Oxide) film 41 as a multilayered film of the silicon nitride film and silicon oxide film is formed. The NO film 41 functions as a capacitor insulating film. An arsenic-doped amorphous silicon layer 43 is formed on the capacitor insulating film 41 to fill the trench 40. The amorphous silicon layer 43 is removed to a predetermined depth in the trench 40 by RIE or the like. The amorphous silicon layer 43 left in the trench 40 in this way functions as a storage node electrode of the cell capacitor. Next, the capacitor insulating film 41 at the upper portion of the trench 40 is removed by RIE or the like. A silicon oxide film 42 is formed in each trench 40 using TEOS. At this time, the silicon oxide film 42 must be formed not to completely fill the trench 40. The silicon oxide film 42 is etched by RIE or the like to leave the silicon oxide film 42 only on the sidewall of the trench 40 on the capacitor insulating film 41. The thus formed silicon oxide film 42 serves as a collar oxide film. Next, an arsenic-doped amorphous silicon layer 44 is formed in the trench 40 again to fill the trench 40. After that, the amorphous silicon layer 44 in the trench 40 is etched to a depth of about 1,000 Å from the surface by RIE or the like. A silicon oxide film 45 is formed in the trench 40 using TEOS to fill the trench 40. The opening portion of the trench 40 is covered with the silicon oxide film 45. After that, part of the silicon oxide film 45 and the silicon oxide films 60 and 61 are removed by CMP (Chemical Mechanical Polishing) using the silicon nitride film 48 as a stopper. As a result, the structure shown in FIG. 34 is obtained. In the above way, the trench-shaped cell capacitors CC are completed.

Next, a photoresist is applied onto the silicon nitride film 48 and silicon oxide film 45. The photoresist is patterned into the formation pattern of the fin-shaped silicon layers 11 using photolithography. The silicon nitride film 48, silicon oxide film 47, and silicon layers 11 are etched by RIE using the photoresist as a mask. Consequently, the plurality of fin-shaped silicon layers 11 laid out in a staggered pattern are formed, as shown in FIGS. 35A to 35C. After that, the photoresist is removed, and the silicon layers 11 are cleaned using an HF-based chemical solution. A silicon oxide film 15 having a thickness of about 50 Å is formed on the sidewalls of the silicon layers 11 by thermal oxidation or the like. The silicon oxide film 15 functions as the gate insulating film.

A boron-doped polysilicon layer 66 is formed on the fin-shaped silicon layers 11, the silicon nitride films 21 exposed upon removing the silicon layers 11, and the silicon oxide films 45 at the capacitor opening portions. The polysilicon layer 66 is polished by CMP using the silicon nitride films 48 on the silicon layers 11 as a stopper. Subsequently, a boron-doped polysilicon layer 67 having a thickness of about 1,000 Å and a silicon nitride film 49 having a thickness of about 2,000 Å are formed on the polysilicon layer 66. Then, a photoresist is applied onto the silicon nitride film 49 and patterned into a gate electrode formation pattern. The silicon nitride film 49, silicon layers 67 and 66, and silicon nitride film 48 are sequentially patterned by RIE or the like. As a result, gate electrodes 16 as shown in FIGS. 36A to 36C are completed.

Figure 37:
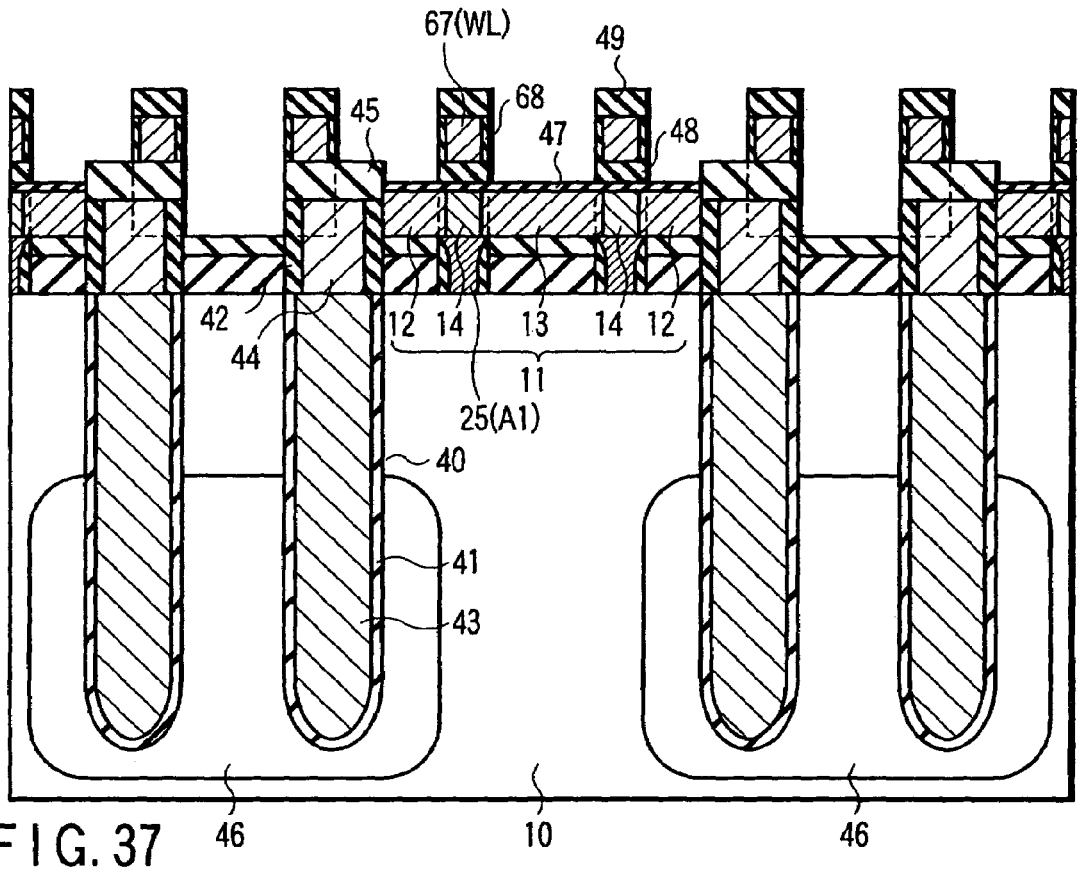
FIGS. 37 and 38 are sectional views of the ninth and 10th steps in fabricating the semiconductor device according to the third embodiment of the present invention.

As shown in FIG. 37, the sidewalls of the exposed silicon layers 66 and 67 are oxidized by thermal oxidation at 1,000° C. or more to form a silicon oxide film 68 having a thickness of about 100 Å. Regions other than the silicon layers 11 are covered with a resist by photolithography. An n-type impurity is implanted into the silicon layers 11 by ion implantation. After that, annealing at a high temperature of 950° C. or more is performed for a short time as needed to activate the implanted impurity. As a result, a source region 12 and drain region 13 are formed in each silicon layer 11. The region between the source region 12 and the drain region 13 becomes a channel region 14, so a cell transistor is completed.

Figure 38:
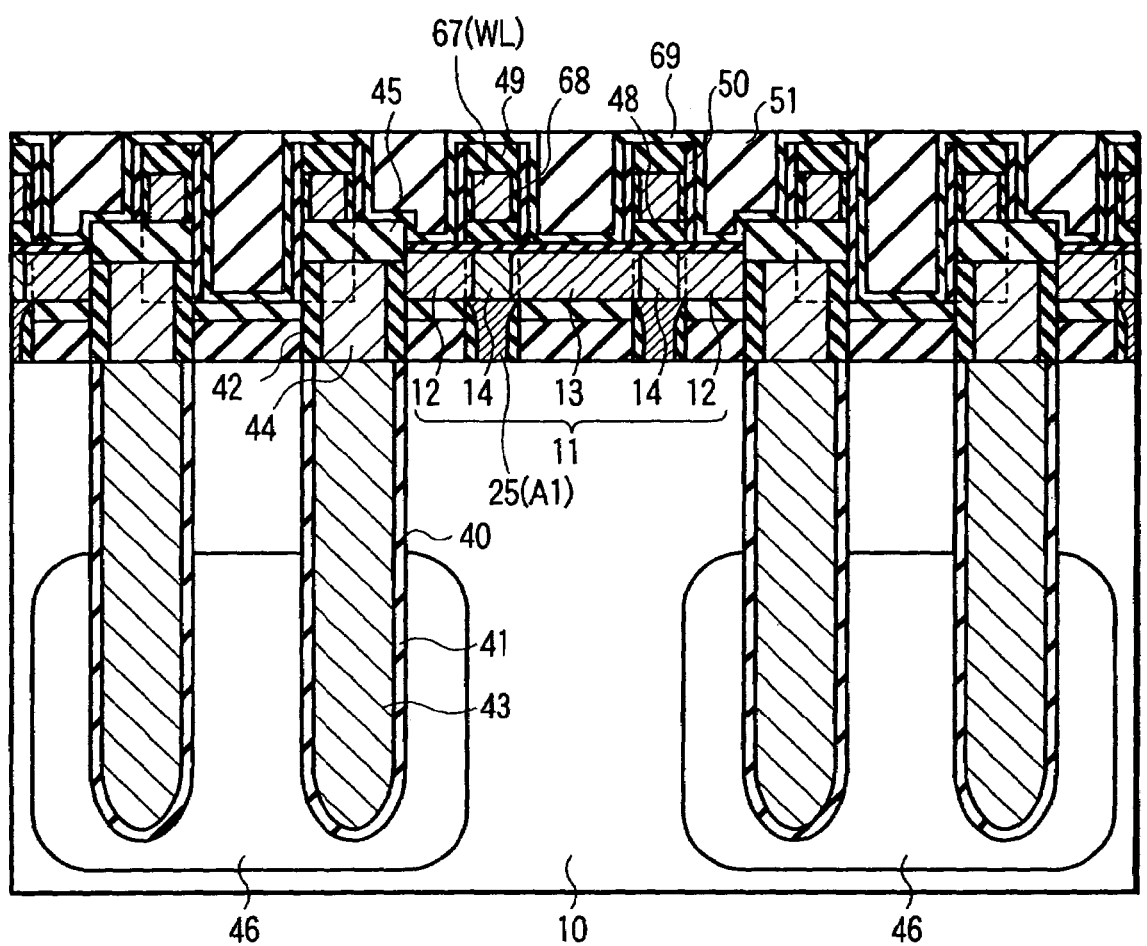

As shown in FIG. 38, a silicon nitride film 50 having a thickness of about 300 Å is formed on the silicon layers 11 and the silicon oxide films 45 on the cell capacitors to cover the gate electrodes 16. The silicon nitride film 50 is etched by RIE and left on the sidewalls of the gate electrodes 16. Subsequently, a silicon nitride film 69 having a thickness of about 80 Å is formed to cover the gate electrodes 16. A boron- and phosphorus-doped silicon oxide film (BPSG: Boron Phosphorous Silicate Glass) 51 having a thickness of about 5,000 Å is formed on the silicon nitride film 69. The silicon oxide film 51 is polished by CMP using the silicon nitride film 69 as a stopper.

A photoresist is applied onto the silicon oxide film 51 and silicon nitride film 69 and patterned into a surface strap pattern by photolithography. Contact holes to be used to form the node contacts NC are formed in the silicon oxide film 51 by RIE or the like using the patterned photoresist and the silicon nitride films 49 and 69 on the gate electrodes 16 as a mask. In addition, the silicon nitride film 69 and silicon oxide films 47 and 45 at the bottom portion of each contact hole are etched to expose the silicon layer 11 (source region 12) and the conductive layer 44 in the cell capacitor to the bottom portion of the contact hole. After the cleaning step, an amorphous silicon layer heavily doped with phosphorus is formed in each contact hole. The amorphous silicon layer is polished by CMP using the silicon oxide film 51 as a stopper to complete the node contact plugs NC.

A silicon oxide film 53 having a thickness of about 2,000 Å is formed on the silicon oxide film 51 to cover the node contact plugs NC and gate electrodes 16. Contact holes reaching the silicon layers (drain regions 13) 11 are formed from the surface of the silicon oxide film 53 by photolithography and etching. The contact holes are used to form the bit line contact plugs BC. At this time, contact holes necessary in the peripheral regions are also simultaneously formed. After that, the photoresist is removed, and cleaning is performed. A Ti/TiN film is formed on the side surfaces and bottom surfaces of the contact holes by, e.g., sputtering. Subsequently, a tungsten layer is formed in each contact hole to fill the contact hole. The tungsten layer and Ti/TiN layer are polished by CMP using the silicon oxide film 53 as a stopper to complete the bit line contact plugs BC. A metal interconnection layer 54 in contact with the bit line contact plugs BC is formed on the silicon oxide film 53. The metal interconnection layer 54 functions as the bit lines BL.

With the above processes, the DRAM shown in FIGS. 27 to 28C is completed.

According to the DRAM of the third embodiment, the leakage current flowing in a cell transistor can be reduced, as in the first embodiment. As a result, the reliability for data holding of the DRAM can be increased.

Reduction of the channel width of a MOS transistor has conventionally been done by increasing the impurity concentration of a well. However, when the impurity concentration of a well is increased, the leakage current at the pn junction between the well and the source region and drain region increases. Hence, it is difficult in a cell transistor of a DRAM to increase the impurity concentration of the well. A fin MOS transistor has been proposed as a structure capable of improving the characteristics without increasing the concentration of the well. A fin MOS transistor is normally formed on an SOI substrate. However, an SOI substrate has a floating body effect and is therefore unsuitable for a DRAM. A fin MOS transistor to be applied to a DRAM is formed using not SOI but bulk silicon as a substrate. In this case, however, it is difficult to control the leakage current that flows in a region near the substrate, as described in the prior art.

Conversely, in the structure according to the third embodiment, the portion under the source region and drain region is completely covered with the insulating film STI. Hence, the only leakage current path that flows from the source region to the drain region is the path through the well region that can be sufficiently controlled by the gate voltage. Hence, the leakage current controllability of a fin MOS transistor, which poses a problem in the prior art, can be improved, and the reliability of a DRAM memory cell can be increased.

In addition, as in the first embodiment, formation of a leakage current path through the silicon substrate 10 can effectively be prevented.

In this embodiment, the connection region A1 is formed from the silicon layer 25. However, the connection region A1 may be formed from the silicon layer 11, as described in the modification to the first embodiment.

A method for fabricating a semiconductor device according to the fourth embodiment of the present invention will be described next with reference to FIGS. 39 to 41. In this embodiment, the second and third embodiments are combined. The DRAM fabricating method described in the third embodiment is applied to a DRAM using an SOI substrate. FIGS. 39 to 41 are sectional views sequentially showing steps in fabricating a DRAM according to the fourth embodiment and, more particularly, sectional views corresponding to the direction along the line 28B-28B in FIG. 28A.

First, as described in the second embodiment with reference to FIG. 17, a silicon oxide film 31 and silicon nitride film 32 are sequentially formed on an SOI substrate 30.

Next, as described in the second embodiment with reference to FIG. 18, the silicon nitride film 32 and silicon oxide film 31 and a silicon layer 34 and silicon oxide film 33 are sequentially etched by photolithography and etching. As a result, as shown in FIG. 39, holes 23 are formed. The formation pattern of the holes 23 is the pattern shown in FIG. 29A described in the third embodiment.

With the steps described in the second embodiment with reference to FIGS. 19 and 20, a silicon oxide film 24 is formed on the sidewall of each hole 23 to obtain the structure shown in FIG. 40. In this structure, a insulating film STI is formed from the silicon oxide films 33 and 24.

As described in the second embodiment with reference to FIG. 21, an amorphous silicon layer 36 is formed on the silicon layer 34 and in the holes 23. Subsequently, annealing is performed.

With the steps described in the third embodiment, cell capacitors are formed. More specifically, a silicon oxide film 47 and silicon nitride film 48 are sequentially formed on the silicon layer 36. In addition, a boron-doped silicon oxide film 60 and silicon oxide film 61 are sequentially formed on the silicon nitride film 48. Holes 62 are formed by lithography and etching, as shown in FIG. 41. The formation pattern of the holes 62 is the pattern shown in FIG. 31A described in the third embodiment.

After that, the steps shown in FIGS. 32 to 38 of the third embodiment are executed to complete the DRAM shown in FIGS. 27 to 28C.

According to the structure and fabricating method of the fourth embodiment, no floating body effect is generated in the SOI substrate, as described in the second embodiment. Hence, in the fourth embodiment, advantages of use of the SOI substrate can be obtained, and simultaneously, any adverse affect by the floating body effect can be eliminated. Hence, the operation reliability of the cell transistor can be increased. In a conventional DRAM-embedded system LSI, a bulk substrate is used in a region where DRAMs are formed, and an SOI substrate is used in a region where the remaining digital circuits are formed. That is, a patterned SOI substrate is used. However, in the structure according to this embodiment, a DRAM can be formed on an SOI substrate, and no patterned SOI substrate needs to be used. Hence, the fabricating step of a system LSI can be simplified, and the fabricating cost can be reduced.

In this embodiment, the hole 23 is filled with the silicon layer 36. However, as described in the second embodiment with reference to FIGS. 26 and 27, this step may be divided into two steps. In the third and fourth embodiments, a DRAM having trench-shaped cell capacitors has been described. These embodiments can also be applied to a DRAM having stacked cell capacitors, as a matter of course. In this case, a fin-shaped cell transistor is formed by the steps described in the above embodiments, and the cell transistor is covered with an interlayer dielectric film. Then, a stacked cell capacitor is formed on the interlayer dielectric film by a conventional step. The fin MOS transistors according to the first to fourth embodiments of the present invention can be applied not only to a DRAM but also to any semiconductor memory including a transistor, for example, a ferroelectric memory having a ferroelectric capacitor.

The orders of the fabricating steps in the first to fourth embodiments is not limited to the above orders and can be changed as much as possible.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for fabricating a semiconductor device, comprising:

forming a first insulating film on a first semiconductor layer;

making a hole that reaches the first semiconductor layer in the first insulating film;

forming a second semiconductor layer on the first insulating film and in the hole;

patterning the second semiconductor layer into a columnar shape to make part of the second semiconductor layer cover the hole;

forming a gate insulating film on a side surface of the second semiconductor layer;

forming a third semiconductor layer on the gate insulating film and first insulating film;

patterning the third semiconductor layer and leaving the third semiconductor layer on a side surface of the second semiconductor layer in a region that should be a channel region to form a gate electrode; and forming source and drain regions in a region of the second semiconductor layer located on the first insulating film.

2. A method according to claim 1, further comprising after forming the hole, forming a second insulating film on the first insulating film and in the hole not to completely fill the hole, and partially removing the second insulating film to expose the first semiconductor layer to a bottom portion of the hole while leaving the second insulating film on a sidewall of the hole.

3. The method according to claim 1, further comprising:

after forming the second semiconductor layer, making a trench that reaches from the second semiconductor layer to the first semiconductor layer;

forming a plate electrode in a partial region in the first semiconductor layer around the trench;

forming a capacitor insulating film on an inner wall of the trench; and forming a storage node electrode in the trench to fill the trench, and after forming the source and drain regions, forming a contact plug which electrically connects the source region and the storage node electrode, wherein, in patterning the second semiconductor layer into a columnar shape, the second semiconductor layer is patterned such that a region where the source region is to be formed in the second semiconductor layer into contact with the trench.

4. A method for fabricating a semiconductor device, comprising:

making a hole in a substrate prepared by sequentially forming a first insulating film and second semiconductor layer on a first semiconductor layer, the hole extending through the second semiconductor layer and the first insulating film to expose the first semiconductor layer to a bottom portion of the hole;

forming a third semiconductor layer on the second semiconductor layer and in the hole;

patterning the second and third semiconductor layers into a columnar shape to make part of the third semiconductor layer cover the hole;

forming a gate insulating film on a side surface of the second and third semiconductor layers;

forming a fourth semiconductor layer on the gate insulating film and first insulating film;

patterning the fourth semiconductor layer and leaving the fourth semiconductor layer on a side surface of the second and third semiconductor layers in a region that should be a channel region to form a gate electrode; and forming source and drain regions in a region of the second and third semiconductor layers located on the first insulating film.

5. The method according to claim 4, further comprising after making the hole, forming a second insulating film on the second semiconductor layer and in the hole not to completely fill the hole, and partially removing the second insulating film to expose the first semiconductor layer to a bottom portion of the hole while leaving the second insulating film on a sidewall of the hole.

6. The method according to claim 4, further comprising:

after forming the third semiconductor layer, forming a trench that reaches from the third semiconductor layer to the first semiconductor layer;

forming a plate electrode in a partial region in the first semiconductor layer around the trench;

forming a capacitor insulating film on an inner wall of the trench; and forming a storage node electrode in the trench to fill the trench, and after forming the source and drain regions, forming a contact plug which electrically connects the source region and the storage node electrode, wherein, in patterning the second and third semiconductor layers into a columnar shape, the second and third semiconductor layers are patterned such that a region where the source region is to be formed in the second and third semiconductor layers into contact with the trench.

* * * * *